US012282710B2

(12) United States Patent
King et al.

(10) Patent No.: US 12,282,710 B2
(45) Date of Patent: Apr. 22, 2025

(54) FLEXIBLE MANIPULATION DEVICE AND METHOD FOR FABRICATING THE SAME

(71) Applicant: Carnegie Mellon University, Pittsburgh, PA (US)

(72) Inventors: Jonathan King, Pittsburgh, PA (US); Nancy S. Pollard, Pittsburgh, PA (US); Stelian Coros, Zürich (CH); Kai-Hung Chang, El Cerrito, CA (US); Cornelia Ulrike Bauer, Pittsburgh, PA (US); Dominik Bauer, Pittsburgh, PA (US); Daniele Moro, Boise, ID (US)

(73) Assignee: Carnegie Mellon University, Pittsburgh, PA (US)

( * ) Notice: Subject to any disclaimer, the term of this patent is extended or adjusted under 35 U.S.C. 154(b) by 962 days.

(21) Appl. No.: 17/281,817

(22) PCT Filed: Oct. 3, 2019

(86) PCT No.: PCT/US2019/054487
§ 371 (c)(1),
(2) Date: Mar. 31, 2021

(87) PCT Pub. No.: WO2020/072767
PCT Pub. Date: Apr. 9, 2020

(65) Prior Publication Data
US 2022/0004670 A1 Jan. 6, 2022

Related U.S. Application Data

(60) Provisional application No. 62/766,142, filed on Oct. 3, 2018.

(51) Int. Cl.
*G06F 30/10* (2020.01)
*B25J 3/04* (2006.01)
(Continued)

(52) U.S. Cl.
CPC ................ *G06F 30/10* (2020.01); *B25J 3/04* (2013.01); *B25J 9/104* (2013.01); *B25J 13/02* (2013.01);
(Continued)

(58) Field of Classification Search
CPC ............ G06F 30/10; G06F 30/27; B25J 3/04; B25J 9/104; B25J 13/02; B25J 15/0009; G06N 3/008
(Continued)

(56) References Cited

U.S. PATENT DOCUMENTS

| 2006/0279573 A1 | 12/2006 | Pannese et al. |
| 2011/0071678 A1 | 3/2011 | Ihrke et al. |
| 2018/0079075 A1 | 3/2018 | Ciocarlie et al. |

FOREIGN PATENT DOCUMENTS

WO 03035336 A1 5/2003

OTHER PUBLICATIONS

Schlagenhauf_2018 (Interactive Design and Control of Tendon-Driven Soft Foam Robot Hands, Oct. 1, 2018). (Year: 2018).*
(Continued)

*Primary Examiner* — Brian S Cook
(74) *Attorney, Agent, or Firm* — The Webb Law Firm

(57) ABSTRACT

A manipulation device includes an appendage extending from a base, the appendage comprising a flexible material having a resting pose and adapted to be deformed into a plurality of different poses, and at least one tendon attached to an end of the appendage and passing through the base or a portion of the appendage between the base and the distal end, such that actuation of the at least one tendon causes deformation of the appendage from the resting pose to a new pose. Systems and methods for fabricating and optimizing a manipulation device are also provided.

20 Claims, 11 Drawing Sheets

(51) Int. Cl.
| | |
|---|---|
| B25J 9/10 | (2006.01) |
| B25J 13/02 | (2006.01) |
| B25J 15/00 | (2006.01) |
| G06F 30/27 | (2020.01) |
| G06N 3/008 | (2023.01) |

(52) U.S. Cl.
CPC .......... *B25J 15/0009* (2013.01); *G06F 30/27* (2020.01); *G06N 3/008* (2013.01)

(58) Field of Classification Search
USPC .......................................................... 703/1
See application file for complete search history.

(56) References Cited

OTHER PUBLICATIONS https://clics-network.org Continuous Learning in International Collaborative Studies (CLICS) website used for Massive Open Online Courses, Summer Schools, Student and Research Exchange, and Lectures (Year: 2018).* http://graphics.cs.cmu.edu/nsp (Year: 2018).*

Amjadi et al., "Stretchable, Skin-Mountable, and Wearable Strain Sensors and Their Potential Applications: A Review", Advanced Functional Materials, 2016, pp. 1-21.

Andrieu et al., "An Introduction to MCMC for Machine Learning", Machine Learning, 2003, pp. 5-43, vol. 50.

Asfour et al., "ARMAR-III: An Integrated Humanoid Platform for Sensory-Motor Control", 2006 6th IEEE-RAS International Conference on Humanoid Robots, 2006, pp. 169-175.

Bern et al., "Fabrication, Modeling, and Control of Plush Robots", Proceedings of the International Conference on Intelligent Robots and Systems, 2017, pp. 1-8.

Bern et al., "Interactive Design of Animated Plushies", ACM Transactions on Graphics, Jul. 2017, pp. 1-12, vol. 36:4:80.

Brown et al., "Universal robotic gripper based on the jamming of granular material", Proceedings of the National Academy of Sciences, Nov. 2010, pp. 18809-18814, vol. 107:44.

Bullock et al., "A Hand-Centric Classification of Human and Robot Dexterous Manipulation", IEEE Transactions on Haptics, Apr.-Jun. 2013, pp. 129-144, vol. 6:2.

Butterfass et al., "DLR's Multisensory Articulated Hand. Part I: Hard- and Software Architecture", Proceedings of the 1998 IEEE International Conference on Robotics & Automation, 1998, pp. 2081-2086.

Calisti et al., "An octopus—bioinspired solution to movement and manipulation for soft robots", Bioinspiration & biomimetics, 2011, pp. 1-11, vol. 6.

Chang et al., "PID controller design of nonlinear systems using an improved particle swarm optimization approach", Communications in Nonlinear Science and Numerical Simulation, 2010, pp. 3632-3639, vol. 15.

Chang et al., "Video survey of pre-grasp interactions in natural hand activities", Understanding the Human Hand for Advancing Robotic Manipulation, 2009, pp. 1-2.

Chen et al., "Soft Actuator Mimicking Human Esophageal Peristalsis for a Swallowing Robot", IEEE/ASME Transactions on Mechatronics, Aug. 2014, pp. 1300-1308, vol. 19:4.

Chiha et al., "Tuning PID Controller Using Multiobjective Ant Colony Optimization", Applied Computational Intelligence and Soft Computing, 2012, pp. 1-7, vol. 2012.

Chiong et al., "Nature-Inspired Algorithms for Optimisation", 2009, pp. 1-523, vol. 193, Springer, Berlin.

Cianchetti et al., "Bioinspired locomotion and grasping in water: the soft eight-arm OCTOPUS robot", Bioinspiration & Biomimetics, 2015, pp. 1-20, vol. 20.

Cignoni et al., "MeshLab: an Open-Source Mesh Processing Tool", Eurographics Italian Chapter Conference, 2008, pp. 1-8.

Cobos et al., "Efficient Human Hand Kinematics for Manipulation Tasks", 2008 IEEE/RSJ International Conference on Intelligent Robots and Systems, Sep. 2008, pp. 2246-2251.

Cutkosky, "Climbing with adhesion: from bioinspiration to biounderstanding", Interface Focus, 2015, pp. 1-9, vol. 5.

Deimel et al., "Automated Co-Design of Soft Hand Morphology and Control Strategy for Grasping", 2017 IEEE/RSJ International Conference on Intelligent Robots and Systems (IROS), Sep. 2017, pp. 1213-1218, Sep. 2017.

Deimel et al., "A Compliant Hand Based on a Novel Pneumatic Actuator", 2013 IEEE International Conference on Robotics and Automation (ICRA), May 2013, pp. 2039-2045.

Deimel et al., "A novel type of compliant and underactuated robotic hand for dexterous grasping", The International Journal of Robotics Research, 2016, pp. 161-185, vol. 35:1-3.

Duriez et al., "Control of Elastic Soft Robots based on Real-Time Finite Element Method", 2013 IEEE International Conference on Robotics and Automation, 2013, pp. 3982-3987.

Elliot et al., "A Classifcation of Manipulative Hand Movements", Developmental Medicine & Child Neurology, 1984, pp. 283-296, vol. 26.

Feix et al., "The GRASP Taxonomy of Human Grasp Types", IEEE Transactions on Human-Machine Systems, 2015, pp. 1-12.

Fraser, "Chapter 19: Joseph Louis Lagrange, Théorie des fonctions analytiques, First Edition (1797)," Landmark Writings in Western Mathematics, 1640-1940, 2005, pp. 258-276.

Fukaya et al., "Design of the TUAT/Karlsruhe Humanoid Hand", IEEE/RSJ International Conference on Intelligent Robots and Systems (IROS 2000), 2000, pp. 1754-1759, vol. 3.

Fukaya et al., "Development of a Five-Finger Dexterous Hand without Feedback control: the TUAT/Karlsruhe Humanoid Hand", 2013 IEEE/RSJ International Conference on Intelligent Robots and Systems, Nov. 2013, pp. 4533-4540.

Gafford et al., "Shape Deposition Manufacturing of a Soft, Atraumatic, Deployable Surgical Grasper", Journal of Medical Devices, 2014, pp. 1-3, vol. 8.

Gaiser et al., "A New Anthropomorphic Robotic Hand", 2008—8th IEEE-RAS International Conference on Humanoid Robots, Dec. 2008, pp. 418-422.

Giorelli et al., "Neural Network and Jacobian Method for Solving the Inverse Statics of a Cable-Driven Soft Arm With Nonconstant Curvature", IEEE Transactions on Robotics, Aug. 2015, pp. 823-834, vol. 31:4.

Gorissen et al., "Elastic Inflatable Actuators for Soft Robotic Applications", Advanced Materials, 2017, pp. 1-28.

Gustus et al., "Human hand modelling: kinematics, dynamics, applications", Biological Cybernetics, 2012, pp. 741-755, vol. 106.

Hastings, "Monte Carlo Sampling Methods Using Markov Chains and Their Applications", Biometrika, Apr. 1970, pp. 97-109, vol. 57:1.

Hiller et al., "Automatic Design and Manufacture of Soft Robots", IEEE Transactions on Robotics, Apr. 2012, pp. 457-466, vol. 28:2.

Hornby et al., "The Advantages of Generative Grammatical Encodings for Physical Design", Proceedings of the 2001 Congress on Evolutionary Computation (IEEE Cat. No. 01TH8546), May 2001, pp. 600-607, vol. 1.

Hoshino et al., "Pinching at finger tips for humanoid robot hand", Proceedings of the 12th International Conference on Advanced Robotics, 2005, pp. 1-9.

Iberall, "Grasp Planning for Human Prehension", Proceedings of the 10th International Joint Conference on Artificial Intelligence, 1987, pp. 1153-1156.

Ilievski et al., "Soft Robotics for Chemists", Angew. Chem. Int. Ed., 2011, pp. 1890-1895, vol. 50.

Inouye et al., "Anthropomorphic tendon-driven robotic hands can exceed human grasping capabilities following optimization", The International Journal of Robotics Research, 2014, pp. 694-705, vol. 33:5.

Jacobsen et al., "Design of the Utah/M.I.T. Dextrous Hand", Proceedings on IEEE International Conference on Robotics and Automation, 1986, pp. 1520-1532.

Jeong et al., "Design and analysis of an origami-based three-finger manipulator", Robotica, 2018, pp. 261-274, vol. 36.

(56) References Cited

OTHER PUBLICATIONS

Jiang et al., "A Two-Level Approach for Solving the Inverse Kinematics of an Extensible Soft Arm Considering Viscoelastic Behavior", 2017 IEEE International Conference on Robotics and Automation (ICRA), 2017, pp. 1-7.
Kaltenbrunner et al., "An ultra-lightweight design for imperceptible plastic electronics", Nature, 2013, pp. 458-466, vol. 499.
Kang et al., "A Framework for Recognizing Grasps", Robotics Institute, 1991, pp. 1-40, Carnegie Mellon University, Pittsburgh, Pennsylvania.
Katzschmann et al., "Autonomous Object Manipulation Using a Soft Planar Grasping Manipulator", Soft Robotics, 2015, pp. 155-164, vol. 2:4.
Kawasaki et al., "Dexterous Anthropomorphic Robot Hand With Distributed Tactile Sensor: Gifu Hand II", IEEE/ASME Transactions on Mechatronics, Sep. 2002, pp. 296-303, vol. 7:3.
Kim et al., "Soft robotics: a bioinspired evolution in robotics", Trends in Biotechnology, May 2013, pp. 287-294, vol. 31:5.
Landsmeer, "Power Grip and Precision Handling", Annals of the Rheumatic Diseases, 1962, pp. 164-170, vol. 21.
Largilliere et al., "Real-time Control of Soft-Robots using Asynchronous Finite Element Modeling", ICRA, Jun. 2015, pp. 1-6.
Larson et al., "Highly stretchable electroluminescent skin for optical signaling and tactile sensing", Science, Mar. 2016, pp. 1071-1074, vol. 351:6277.
Wolpert et al., "No Free Lunch Theorems for Search", Technical Report, Santa Fe Institute, 1995, pp. 1-32.
Xu et al., "Design of a Highly Biomimetic Anthropomorphic Robotic Hand towards Artificial Limb Regeneration", 2016 IEEE International Conference on Robotics and Automation (ICRA), 2016, pp. 3485-3492.
Yap et al., "High-Force Soft Printable Pneumatics for Soft Robotic Applications", Soft Robotics, 2016, pp. 144-158, vol. 3:3.
Zhou et al., "A Feature-Based Approach to Automatic Injection Mold Generation", Proceedings Geometric Modeling and Processing 2000, Theory and Applications, Apr. 2000, pp. 57-68.
Liberti, "Introduction to Global Optimization", LIX, Ecole Polytechnique, 2008, pp. 1-43, Palaiseau F-91128, France.
Lin et al., "Automatic generation of mold-piece regions and parting curves for complex CAD models in multi-piece mold design", Computer-Aided Design, 2014, pp. 15-28, vol. 57.
Liu et al., "Multisensory Five-Finger Dexterous Hand: The DLR/HIT Hand II", 2008 IEEE/RSJ International Conference on Intelligent Robots and Systems, 2008, pp. 3692-3697.
Lovchik et al., "The Robonaut Hand: A Dexterous Robot Hand For Space", Proceedings of the 1999 IEEE International Conference on Robotics & Automation, 1999, pp. 907-912.
Ma et al., "Yale Openhand Project: Optimizing Open-Source Hand Designs for Ease of Fabrication and Adoption", IEEE Robotics and Automation Magazine, Mar. 2017, pp. 32-40.
Marchese et al., "Design and Control of a Soft and Continuously Deformable 2D Robotic Manipulation System", Proceedings—IEEE International Conference on Robotics and Automation, 2014, pp. 2189-2196.
Marchese et al., "Design, kinematics, and control of a soft spatial fluidic elastomer manipulator", The International Journal of Robotics Research, 2016, pp. 840-869, vol. 35:7.
Martinez et al., "Robotic Tentacles with Three-Dimensional Mobility Based on Flexible Elastomers", Advanced Materials, 2013, pp. 205-212.
McCann et al., "A Compiler for 3D Machine Knitting", Association for Computing Machinery (ACM), 2016, pp. 1-11.
Metropolis et al., "Equation of State Calculations by Fast Computing Machines", The Journal of Chemical Physics, Jun. 1953, pp. 1087-1092, vol. 21:6.
Metropolis et al., "The Monte Carlo Method", Journal of the American Statistical Association, Sep. 1949, pp. 335-341, vol. 44:247.
Mghames et al., "Design, Control and Validation of the Variable Stiffness Exoskeleton FLExo", IEEE International Conference on Rehabilitation Robotics, Jul. 2017, pp. 1-8.
Moro et al., "Inverse Kinematics of Soft Robots using Neural Networks", Carnegie Mellon Robotics Institute Summer Scholars Working Papers Journal, 2017, pp. 112-117.
Mosadegh et al., "Pneumatic Networks for Soft Robotics that Actuate Rapidly", Advanced Functional Materials, 2014, pp. 2163-2170, vol. 24.
Murray et al., "A Mathematical Introduction to Robotic Manipulation", 1994, pp. 1-456, CRC Press.
Mutlu et al., "3D printed flexure hinges for soft monolithic prosthetic fingers", Soft Robotics, 2016, pp. 120-133, vol. 3:3.
Nakamura et al., "The Complexities of Grasping in the Wild", 2017 IEEE-RAS 17th International Conference on Humanoid Robotics, 2017, pp. 233-240.
Napier, "The Prehensile Movements of the Human Hand", The Journal of Bone and Joint Surgery, Nov. 1956, pp. 902-913, vol. 38 B:4.
Neumaier, "Global optimization and constraint satisfaction", 2003, pp. 1-50. Retrieved from http:// www.mat.univie.ac.at/~neum/ms/robslides.pdf. Accessed: Aug. 10, 2018. 18, 19.
Odhner et al., "A compliant, underactuated hand for robust manipulation", The International Journal of Robotics Research, 2014, pp. 736-752, vol. 33:5.
Ohta et al., "Design of a Lightweight Soft Robotic Arm Using Pneumatic Artificial Muscles and Inflatable Sleeves", Soft Robotics, 2018, pp. 204-215, vol. 5:2.
Okada, "Object-Handling System for Manual Industry", IEEE Transactions on Systems, Man, and Cybernetics, Feb. 1979, pp. 78-89, vol. SMC-9:2.
Pardalos et al., "Handbook of Global Optimization", 2013, vol. 2, Springer Science & Business Media.
Park et al., "Design and Fabrication of Soft Artificial Skin Using Embedded Microchannels and Liquid Conductors", IEEE Sensors Journal, Aug. 2012, pp. 2711-2718, vol. 12:8.
Payne et al., "An Implantable Extracardiac Soft Robotic Device for the Failing Heart: Mechanical Coupling and Synchronization", Soft Robotics, 2017, pp. 241-250, vol. 4:3.
Pelrine et al., "High-Speed Electrically Actuated Elastomers with Strain Greater Than 100%", Science, Feb. 2000, pp. 836-839, vol. 287.
Pollard et al., "Physically Based Grasping Control from Example", Eurographics/ACM SIGGRAPH Symposium on Computer Animation, 2005, pp. 311-318.
Polygerinos et al., "Soft robotic glove for combined assistance and at-home rehabilitation", Robotics and Autonomous Systems, 2015, pp. 135-143, vol. 73.
Polygerinos et al., "Towards a Soft Pneumatic Glove for Hand Rehabilitation", 2013 IEEE/RSJ International Conference on Intelligent Robots and Systems (IROS), 2013, pp. 1512-1517.
Rieffel et al., "Growing and Evolving Soft Robots", Artificial Life, 2014, pp. 143-162, vol. 20.
Ritt, "Book reviews: Lister's The Hand. Diagnosis and indications", Journal of Hand Surgery, 2002, pp. 397, vol. 27:4.
Rolf et al., "Efficient Exploratory Learning of Inverse Kinematics on a Bionic Elephant Trunk", IEEE Transactions on Neural Networks and Learning Systems, Jun. 2014, pp. 1147-1160, vol. 25:6.
Rus et al., "Design, fabrication and control of soft robots", Nature, 2015, pp. 1-23.
Salisbury et al., "Kinematic and Force Analysis of Articulated Mechanical Hands", Journal of Mechanisms, Transmissions, and Automation in Design, Mar. 1983, pp. 35-41, vol. 105.
Saunders et al., "Modeling locomotion of a soft bodied arthropod using inverse-dynamics", Bioinspiration & Biomimetics, Mar. 2011, pp. 1-16.
Schlagenhauf et al., "Control of Tendon-Driven Soft Foam Robot Hands", 2018 IEEE Ras International Conference on Humanoid Robots, 2018, pp. 1-7.
Schlagenhauf, "Interactive Design and Control of Tendon-Driven Soft Foam Robot Hands", Master's Thesis, Karlsruhe Institute of Technology, 2018, pp. 1-80.

(56) References Cited

OTHER PUBLICATIONS

Schulz et al., "A hydraulically driven multifunctional prosthetic hand", Robotica, 2005, pp. 293-299, vol. 23.
Shahinpoor et al., "Ionic polymer-metal composites: I. Fundamentals", Smart Materials and Structures, 2001, pp. 819-833, vol. 10.
Shepherd et al., "Multigait soft robot", Proceedings of the National Academy of Sciences, Dec. 2011, pp. 20400-20403, vol. 108:51.
Shintake et al., "Versatile soft grippers with intrinsic electroadhesion based on multifunctional polymer actuators", Advanced Materials, 2015, pp. 1-28.
Shintake et al., "Soft Robotic Grippers", Advanced Materials, 2018, pp. 1-33, vol. 30.
Simon et al., "Hand Keypoint Detection in Single Images Using Multiview Bootstrapping", CVPR, 2017, pp. 1145-1153.
Sorkine et al., "Laplacian Surface Editing", Eurographics Symposium on Geometry Processing, 2004, pp. 1-10.
Thuruthel et al., "Control Strategies for Soft Robotic Manipulators: A Survey", Soft Robotics, 2018, pp. 149-163, vol. 5:2.
Thuruthel et al., "Learning Global Inverse Kinematics Solutions for a Continuum Robot", ROMANSY 21—Robot Design, Dynamics and Control, 2016, pp. 47-54.
Tierney, "Markov Chains for Exploring Posterior Distributions", The Annals of Statistics, Dec. 1994, pp. 1701-1728, vol. 22:4.
Walsh, "Markov Chain Monte Carlo and Gibbs Sampling", Lecture Notes for EEB 596z, University of Arizona, 2002, pp. 1-24.
Wirekoh et al., "Design of flat pneumatic artificial muscles", Smart Materials and Structures, 2017, pp. 1-10, vol. 26.
Wolpert et al., "No Free Lunch Theorems for Optimization", IEEE Transactions on Evolutionary Computation, Apr. 1997, pp. 67-82, vol. 1:1.

\* cited by examiner

FLEXIBLE MANIPULATION DEVICE AND METHOD FOR FABRICATING THE SAME

CROSS-REFERENCE TO RELATED APPLICATIONS

This application is the United States national phase of International Application No. PCT/US2019/054487, filed Oct. 3, 2019, and claims priority to U.S. Provisional Patent Application No. 62/766,142, filed Oct. 3, 2018, the disclosures of which are hereby incorporated by reference in their entirety.

GOVERNMENT LICENSE RIGHTS

This invention was made with Government support under IIS-1637853 awarded by the National Science Foundation. The Government has certain rights in the invention.

BACKGROUND

1. Field

This disclosure relates generally to manipulation devices and, in non-limiting embodiments, flexible manipulation devices and systems and methods for fabricating and optimizing flexible manipulation devices.

2. Technical Considerations

Existing approaches to soft robotics often rely on expensive and/or difficult to control actuation methods, such as pneumatics and shape memory alloys, in addition to complex fabrication methods, due to their often complex geometries, specialized materials, and reliance on exotic fabrication techniques. The continuously deformable nature of soft devices makes controlling them difficult, due to the variety of degrees of freedom of actuation and deformation. Moreover, existing approaches still often use traditional rigid robotic manipulation devices but simply employ compliant exteriors.

SUMMARY

According to non-limiting embodiments or aspects, provided is a method for fabricating a tendon-driven manipulation device comprising at least one appendage, the method comprising: generating, with at least one processor, a three-dimensional model of the manipulation device; generating, with the at least one processor, at least one simulated tendon connected to the three-dimensional model based on at least one location on the at least one appendage of the three-dimensional model; training, with the at least one processor, an artificial neural network based on simulated activations of the at least one simulated tendon, wherein each simulated activation is based on the at least one location of the at least one simulated tendon and results in at least one pose of the at least one appendage; modifying, with the at least one processor, the at least one location of the at least one simulated tendon; simulating, with the at least one processor, a plurality of poses of the at least one appendage based on the artificial neural network and the at least one location; and connecting at least one tendon to the at least one appendage of the manipulation device based on the location of the at least one simulated tendon.

In non-limiting embodiments or aspects, the method further comprises forming the at least one appendage from at least one of the following materials: foam, silicone, an elastomer, polydimethylsiloxane, rubber, plastic, biological material, nanomaterial, cork, compressed textiles, or any combination thereof. In non-limiting embodiments or aspects, the method further comprises connecting a second end of the at least one tendon to an actuation device configured to actuate the at least one tendon. In non-limiting embodiments or aspects, the at least one simulated tendon is generated based further on a simulated connection point located on the three-dimensional model, wherein each simulated activation is based further on a location of the simulated connection point, and wherein passing the at least one tendon through the portion of the base or the portion of the at least one appendage comprises passing the at least one tendon through a location on the base or the at least one appendage corresponding to the location of the simulated connection point. In non-limiting embodiments or aspects, the at least one tendon comprises at least one of the following: a string, a wire, a cable, or any combination thereof. In non-limiting embodiments or aspects, the simulated activations of the at least one tendon are based on at least one of the following tendon properties: elasticity, stiffness, slack, strength, bend radius, friction, material type, or any combination thereof.

In non-limiting embodiments or aspects, the at least one appendage comprises a joint, wherein connecting the at least one tendon to the manipulation device comprises: connecting a first end of the at least one tendon to the location of the at least one simulated tendon; and passing the at least one tendon through a portion of the at least one appendage below the joint such that the joint is arranged between the location and the portion of the at least one appendage. In non-limiting embodiments or aspects, wherein the at least one location on the at least one appendage is identified based on user input, and wherein the at least one location is modified based on additional user input.

According to non-limiting embodiments or aspects, provided is a system for fabricating a tendon-driven manipulation device comprising at least one appendage, the system comprising: a manipulation device comprising a base, at least one appendage extending from the base, and at least one tendon connected to the appendage; and at least one computing device programmed or configured to: generate a three-dimensional model of the manipulation device; generate at least one simulated tendon relative to the three-dimensional model based on at least one location on the at least one appendage of the three-dimensional model; train an artificial neural network based on simulated activations of the at least one simulated tendon, wherein each simulated activation is based on the at least one location of the at least one simulated tendon and results in at least one pose of the at least one appendage; modify the at least one location of the at least one simulated tendon; and simulate a plurality of poses of the at least one appendage based on the artificial neural network and the at least one location, the at least one tendon is connected to the manipulation device based on the location of the at least one simulated tendon.

In non-limiting embodiments or aspects, the at least one computing device is further programmed or configured to forming the at least one appendage from at least one of the following materials: foam, silicone, an elastomer, polydimethylsiloxane, rubber, plastic, biological material, nanomaterial, cork, compressed textiles, or any combination thereof. In non-limiting embodiments or aspects, the manipulation device further comprises a skin. In non-limiting embodiments or aspects, the at least one tendon is connected to the skin. In non-limiting embodiments or aspects, the at least one tendon comprises a flexor tendon and an extensor tendon, and the at least one simulated tendon comprises a simulated flexor tendon and a simulated extensor tendon. In non-limiting embodiments or aspects, the at least one appendage comprises a plurality of fingers. In non-limiting embodiments or aspects, the manipulation device comprises a molded or printed human hand.

In non-limiting embodiments or aspects, a first end of the at least one tendon is connected to a location corresponding to the location of the at least one simulated tendon, and the at least one tendon passes through a portion of the base or a portion of the at least one appendage between the base and the location. In non-limiting embodiments or aspects, the manipulation device further comprises an actuation device configured to actuate the at least one tendon, and wherein a second end of the at least one tendon is connected to the actuation device. In non-limiting embodiments or aspects, the at least one simulated tendon is generated based further on a simulated connection point located on the three-dimensional model, wherein each simulated actuation is based further on a location of the simulated connection point, and the at least one tendon passes through a location on the base or the at least one appendage corresponding to the location of the simulated connection point. In non-limiting embodiments or aspects, the at least one tendon comprises at least one of the following: a string, a wire, a cable, or any combination thereof. In non-limiting embodiments or aspects, the simulated actuations of the at least one tendon are based on at least one of the following tendon properties: elasticity, stiffness, slack, strength, bend radius, friction, material type, or any combination thereof.

According to non-limiting embodiments or aspects, provided is a computer program product for simulating a tendon-driven manipulation device comprising at least one appendage, comprising at least one non-transitory computer-readable medium including program instructions that, when executed by a computing device, cause the computing device to: generate a three-dimensional model of the manipulation device; generate at least one simulated tendon on the three-dimensional model based on at least one location on the at least one appendage of the three-dimensional model; train an artificial neural network based on simulated activations of the at least one simulated tendon, wherein each simulated activation is based on the at least one location of the at least one simulated tendon and results in at least one pose of the at least one appendage; modify the at least one location of the at least one simulated tendon; and simulate a plurality of poses of the at least one appendage based on the artificial neural network and the at least one location, the at least one tendon is connected to the manipulation device based on the location of the at least one simulated tendon.

According to non-limiting embodiments or aspects, provided is a manipulation device comprising: an appendage extending from a base, the appendage comprising a flexible material having a resting pose and adapted to be deformed into a plurality of different poses; and at least one tendon connected to an end portion of the appendage and passing through the base or a portion of the appendage between the base and the end portion, such that actuation of the at least one tendon causes deformation of the appendage from the resting pose to a new pose.

In non-limiting embodiments or aspects, the manipulation device further comprises: a plurality of appendages extending from the base, wherein each appendage comprises the semi-rigid material; and a plurality of tendons connected to the plurality of appendages, wherein at least one tendon of the plurality of tendons is connected to an end portion of each appendage of the plurality of appendages. In non-limiting embodiments or aspects, the manipulation device further comprises the base. In non-limiting embodiments or aspects, the manipulation device further comprises at least one actuation device connected to the at least one tendon and configured to actuate the at least one tendon.

According to non-limiting embodiments or aspects, provided is a method for optimizing the design of a tendon-driven manipulation device comprising at least one appendage, the method comprising: generating, with a least one processor, a three-dimensional model of the manipulation device; generating, with the at least one processor, a plurality of candidate tendon routings for at least one tendon; evaluating, with the at least one processor, the plurality of candidate tendon routings; and determining, with the at least one processor, at least one optimal tendon routing based on evaluating the plurality of candidate tendon routings.

In non-limiting embodiments or aspects, the method further comprises: initializing, with the at least one processor, the at least one tendon before generating the plurality of candidate tendon routings. In non-limiting embodiments or aspects, the method further comprises: receiving, as input, at least one desired manipulation; and determining a position and orientation of at least one end portion of at least one appendage based on the input, the at least one tendon is initialized based on the at least one desired manipulation. In non-limiting embodiments or aspects, the method further comprises: generating, with the at least one processor, a plurality of candidate actuation forces for the at least one tendon; evaluating, with the at least one processor, the plurality of candidate actuation forces; and determining, with the at least one processor, at least one optimal actuation force based on evaluating the plurality of candidate actuation forces. In non-limiting embodiments or aspects, the actuation forces comprise distances.

According to non-limiting embodiments or aspects, provided is a system for optimizing the design of a tendon-driven manipulation device comprising at least one appendage, comprising at least one computing device programmed or configured to: generate a three-dimensional model of the manipulation device; generate a plurality of candidate tendon routings for at least one tendon; evaluate the plurality of candidate tendon routings; and determine at least one optimal tendon routing based on evaluating the plurality of candidate tendon routings.

In non-limiting embodiments or aspects, the at least one computing device is further programmed or configured to: initialize the at least one tendon before generating the plurality of candidate tendon routings. In non-limiting embodiments or aspects, wherein initializing comprises: sampling a plurality of anchoring nodes; and identifying an optimal path along the model that connects the plurality of anchoring nodes. In non-limiting embodiments or aspects, the at least one computing device is further programmed or configured to: receive, as input, at least one desired manipulation; and determine a position and orientation of at least one end portion of at least one appendage based on the input, the at least one tendon is initialized based on the at least one desired manipulation. In non-limiting embodiments or aspects, the at least one computing device is further programmed or configured to: generate a plurality of candidate actuation forces for the at least one tendon; evaluate the plurality of candidate actuation forces; and determine at least one optimal actuation force based on evaluating the plurality of candidate actuation forces. In non-limiting embodiments or aspects, the actuation forces comprise distances.

Other non-limiting embodiments or aspects will be set forth in the following numbered clauses:

Clause 1: A method for fabricating a tendon-driven manipulation device comprising at least one appendage, the method comprising: generating, with at least one processor, a three-dimensional model of the manipulation device; generating, with the at least one processor, at least one simulated tendon connected to the three-dimensional model based on at least one location on the at least one appendage of the three-dimensional model; training, with the at least one processor, an artificial neural network based on simulated activations of the at least one simulated tendon, wherein each simulated activation is based on the at least one location of the at least one simulated tendon and results in at least one pose of the at least one appendage; modifying, with the at least one processor, the at least one location of the at least one simulated tendon; simulating, with the at least one processor, a plurality of poses of the at least one appendage based on the artificial neural network and the at least one location; and connecting at least one tendon to the at least one appendage of the manipulation device based on the location of the at least one simulated tendon.

Clause 2: The method of clause 1, further comprising forming the at least one appendage from at least one of the following materials: foam, silicone, an elastomer, polydimethylsiloxane, rubber, plastic, biological material, nanomaterial, cork, compressed textiles, or any combination thereof.

Clause 3: The method of clauses 1 or 2, wherein forming the at least one appendage further comprises covering at least a portion of the appendage with a skin.

Clause 4: The method of any of clauses 1-3, wherein connecting the at least one tendon to the manipulation device comprises connecting the tendon to the skin.

Clause 5: The method of any of clauses 1-4, wherein the at least one tendon comprises a flexor tendon and an extensor tendon, and wherein the at least one simulated tendon comprises a simulated flexor tendon and a simulated extensor tendon.

Clause 6: The method of any of clauses 1-5, wherein the at least one appendage comprises a plurality of fingers.

Clause 7: The method of any of clauses 1-6, wherein the manipulation device comprises a molded or printed human hand.

Clause 8: The method of any of clauses 1-7, wherein connecting the at least one tendon to the manipulation device comprises: connecting a first end of the at least one tendon to a location corresponding to the location of the at least one simulated tendon; and passing the at least one tendon through a portion of a base connected to the at least one appendage or a portion of the at least one appendage between the base and the location.

Clause 9: The method of any of clauses 1-8, further comprising connecting a second end of the at least one tendon to an actuation device configured to actuate the at least one tendon.

Clause 10: The method of any of clauses 1-9, wherein the at least one simulated tendon is generated based further on a simulated connection point located on the three-dimensional model, wherein each simulated activation is based further on a location of the simulated connection point, and wherein passing the at least one tendon through the portion of the base or the portion of the at least one appendage comprises passing the at least one tendon through a location on the base or the at least one appendage corresponding to the location of the simulated connection point.

Clause 11: The method of any of clauses 1-10, wherein the at least one tendon comprises at least one of the following: a string, a wire, a cable, or any combination thereof.

Clause 12: The method of any of clauses 1-11, wherein the simulated activations of the at least one tendon are based on at least one of the following tendon properties: elasticity, stiffness, slack, strength, bend radius, friction, material type, or any combination thereof.

Clause 13: The method of any of clauses 1-12, wherein the at least one appendage comprises a joint, and wherein connecting the at least one tendon to the manipulation device comprises; connecting a first end of the at least one tendon to the location of the at least one simulated tendon; and passing the at least one tendon through a portion of the at least one appendage below the joint such that the joint is arranged between the location and the portion of the at least one appendage.

Clause 14: The method of any of clauses 1-13, wherein the at least one location on the at least one appendage is identified based on user input, and wherein the at least one location is modified based on additional user input.

Clause 15: A system for fabricating a tendon-driven manipulation device comprising at least one appendage, the system comprising: a manipulation device comprising a base, at least one appendage extending from the base, and at least one tendon connected to the appendage; and at least one computing device programmed or configured to: generate a three-dimensional model of the manipulation device; generate at least one simulated tendon relative to the three-dimensional model based on at least one location on the at least one appendage of the three-dimensional model; train an artificial neural network based on simulated activations of the at least one simulated tendon, wherein each simulated activation is based on the at least one location of the at least one simulated tendon and results in at least one pose of the at least one appendage; modify the at least one location of the at least one simulated tendon; and simulate a plurality of poses of the at least one appendage based on the artificial neural network and the at least one location, wherein the at least one tendon is connected to the manipulation device based on the location of the at least one simulated tendon.

Clause 16: The system of clause 15, wherein the at least one computing device is further programmed or configured to forming the at least one appendage from at least one of the following materials: foam, silicone, an elastomer, polydimethylsiloxane, rubber, plastic, biological material, nanomaterial, cork, compressed textiles, or any combination thereof.

Clause 17: The system of clauses 15 or 16, wherein the manipulation device further comprises a skin.

Clause 18: The system of any of clauses 15-17, wherein the at least one tendon is connected to the skin.

Clause 19: The system of any of clauses 15-18, wherein the at least one tendon comprises a flexor tendon and an extensor tendon, and wherein the at least one simulated tendon comprises a simulated flexor tendon and a simulated extensor tendon.

Clause 20: The system of any of clauses 15-19, wherein the at least one appendage comprises a plurality of fingers.

Clause 21: The system of any of clauses 15-20, wherein the manipulation device comprises a molded or printed human hand.

Clause 22: The system of any of clauses 15-21, wherein a first end of the at least one tendon is connected to a location corresponding to the location of the at least one simulated tendon, and wherein the at least one tendon passes through a portion of the base or a portion of the at least one appendage between the base and the location.

Clause 23: The system of any of clauses 15-22, wherein the manipulation device further comprises an actuation device configured to actuate the at least one tendon, and wherein a second end of the at least one tendon is connected to the actuation device. Clause 24: The system of any of clauses 15-23, wherein the at least one simulated tendon is generated based further on a simulated connection point located on the three-dimensional model, wherein each simulated actuation is based further on a location of the simulated connection point, and wherein the at least one tendon passes through a location on the base or the at least one appendage corresponding to the location of the simulated connection point.

Clause 25: The system of any of clauses 15-24, wherein the at least one tendon comprises at least one of the following: a string, a wire, a cable, or any combination thereof.

Clause 26: The system of any of clauses 15-25, wherein the simulated actuations of the at least one tendon are based on at least one of the following tendon properties: elasticity, stiffness, slack, strength, bend radius, friction, material type, or any combination thereof.

Clause 27: A computer program product for simulating a tendon-driven manipulation device comprising at least one appendage, comprising at least one non-transitory computer-readable medium including program instructions that, when executed by a computing device, cause the computing device to: generate a three-dimensional model of the manipulation device; generate at least one simulated tendon on the three-dimensional model based on at least one location on the at least one appendage of the three-dimensional model; train an artificial neural network based on simulated activations of the at least one simulated tendon, wherein each simulated activation is based on the at least one location of the at least one simulated tendon and results in at least one pose of the at least one appendage; modify the at least one location of the at least one simulated tendon; and simulate a plurality of poses of the at least one appendage based on the artificial neural network and the at least one location, wherein the at least one tendon is connected to the manipulation device based on the location of the at least one simulated tendon.

Clause 28: A manipulation device comprising: an appendage extending from a base, the appendage comprising a flexible material having a resting pose and adapted to be deformed into a plurality of different poses; and at least one tendon connected to an end portion of the appendage and passing through the base or a portion of the appendage between the base and the end portion, such that actuation of the at least one tendon causes deformation of the appendage from the resting pose to a new pose.

Clause 29: The manipulation device of clause 28, further comprising: a plurality of appendages extending from the base, wherein each appendage comprises the semi-rigid material; and a plurality of tendons connected to the plurality of appendages, wherein at least one tendon of the plurality of tendons is connected to an end portion of each appendage of the plurality of appendages.

Clause 30: The manipulation device of clauses 28 or 29, further comprising the base.

Clause 31: The manipulation device of any of clauses 28-30, wherein the base comprises a hand and wherein the appendage comprises a finger extending from the hand.

Clause 32: The manipulation device of any of clauses 28-31, further comprising at least one actuation device connected to the at least one tendon and configured to actuate the at least one tendon.

Clause 33: The manipulation device of any of clauses 28-32, wherein the at least one tendon comprises a flexor tendon and an extensor tendon, wherein the flexor tendon is connected to the end portion of the appendage and passes through a front side of the base or a portion of a front side of the appendage between the base and the end portion, wherein the extensor tendon is connected to the end portion of the appendage and passes through a back side of the base or a portion of a back side of the appendage between the base and the end portion.

Clause 34: The manipulation device of any of clauses 28-33, wherein the semi-rigid material comprises at least one of the following: foam, silicone, an elastomer, polydimethylsiloxane, rubber, plastic, biological material, nanomaterial, cork, compressed textiles, or any combination thereof.

Clause 35: The manipulation device of any of clauses 28-34, wherein the appendage further comprises a flexible skin covering the semi-rigid material, and wherein the at least one tendon is connected to the flexible skin.

Clause 36: The manipulation device of any of clauses 28-35, wherein the appendage comprises a first joint.

Clause 37: The manipulation device of any of clauses 28-36, wherein the appendage consists of the semi-rigid material.

Clause 38: The manipulation device of any of clauses 28-37, wherein the at least one tendon comprises at least one of the following: a string, a wire, a cable, or any combination thereof.

Clause 39: The manipulation device of any of clauses 28-38, wherein the end portion comprises a material that is more rigid than the flexible material.

Clause 40: A method for optimizing the design of a tendon-driven manipulation device comprising at least one appendage, the method comprising: generating, with a least one processor, a three-dimensional model of the manipulation device; generating, with the at least one processor, a plurality of candidate tendon routings for at least one tendon; evaluating, with the at least one processor, the plurality of candidate tendon routings; and determining, with the at least one processor, at least one optimal tendon routing based on evaluating the plurality of candidate tendon routings.

Clause 41: The method of clause 40, further comprising: initializing, with the at least one processor, the at least one tendon before generating the plurality of candidate tendon routings.

Clause 42: The method of clauses 40 or 41, wherein initializing comprises: sampling a plurality of anchoring nodes; and identifying an optimal path along the model that connects the plurality of anchoring nodes.

Clause 43: The method of any of clauses 40-42, further comprising: receiving, as input, at least one desired manipulation; and determining a position and orientation of at least one end portion of at least one appendage based on the input, wherein the at least one tendon is initialized based on the at least one desired manipulation.

Clause 44: The method of any of clauses 40-43, further comprising: generating, with the at least one processor, a plurality of candidate actuation forces for the at least one tendon; evaluating, with the at least one processor, the plurality of candidate actuation forces; and determining, with the at least one processor, at least one optimal actuation force based on evaluating the plurality of candidate actuation forces.

Clause 45: The method of any of clauses 40-44, wherein the actuation forces comprise distances.

Clause 46: A system for optimizing the design of a tendon-driven manipulation device comprising at least one appendage, comprising at least one computing device programmed or configured to: generate a three-dimensional model of the manipulation device; generate a plurality of candidate tendon routings for at least one tendon; evaluate the plurality of candidate tendon routings; and determine at least one optimal tendon routing based on evaluating the plurality of candidate tendon routings.

Clause 47: The system of clause 46, wherein the at least one computing device is further programmed or configured to: initialize the at least one tendon before generating the plurality of candidate tendon routings.

Clause 48: The system of clauses 46 or 47, wherein initializing comprises: sampling a plurality of anchoring nodes; and identifying an optimal path along the model that connects the plurality of anchoring nodes.

Clause 49: The system of any of clauses 46-48, wherein the at least one computing device is further programmed or configured to: receive, as input, at least one desired manipulation; and determine a position and orientation of at least one end portion of at least one appendage based on the input, wherein the at least one tendon is initialized based on the at least one desired manipulation.

Clause 50: The system of any of clauses 46-49, wherein the at least one computing device is further programmed or configured to: generate a plurality of candidate actuation forces for the at least one tendon; evaluate the plurality of candidate actuation forces; and determine at least one optimal actuation force based on evaluating the plurality of candidate actuation forces.

Clause 51: The system of any of clauses 46-50, wherein the actuation forces comprise distances.

These and other features and characteristics of the present disclosure, as well as the methods of operation and functions of the related elements of structures and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

BRIEF DESCRIPTION OF THE DRAWINGS

Additional advantages and details are explained in greater detail below with reference to the non-limiting, exemplary embodiments that are illustrated in the accompanying schematic figures, in which.

DESCRIPTION OF THE PREFERRED EMBODIMENTS

Figure 1A:
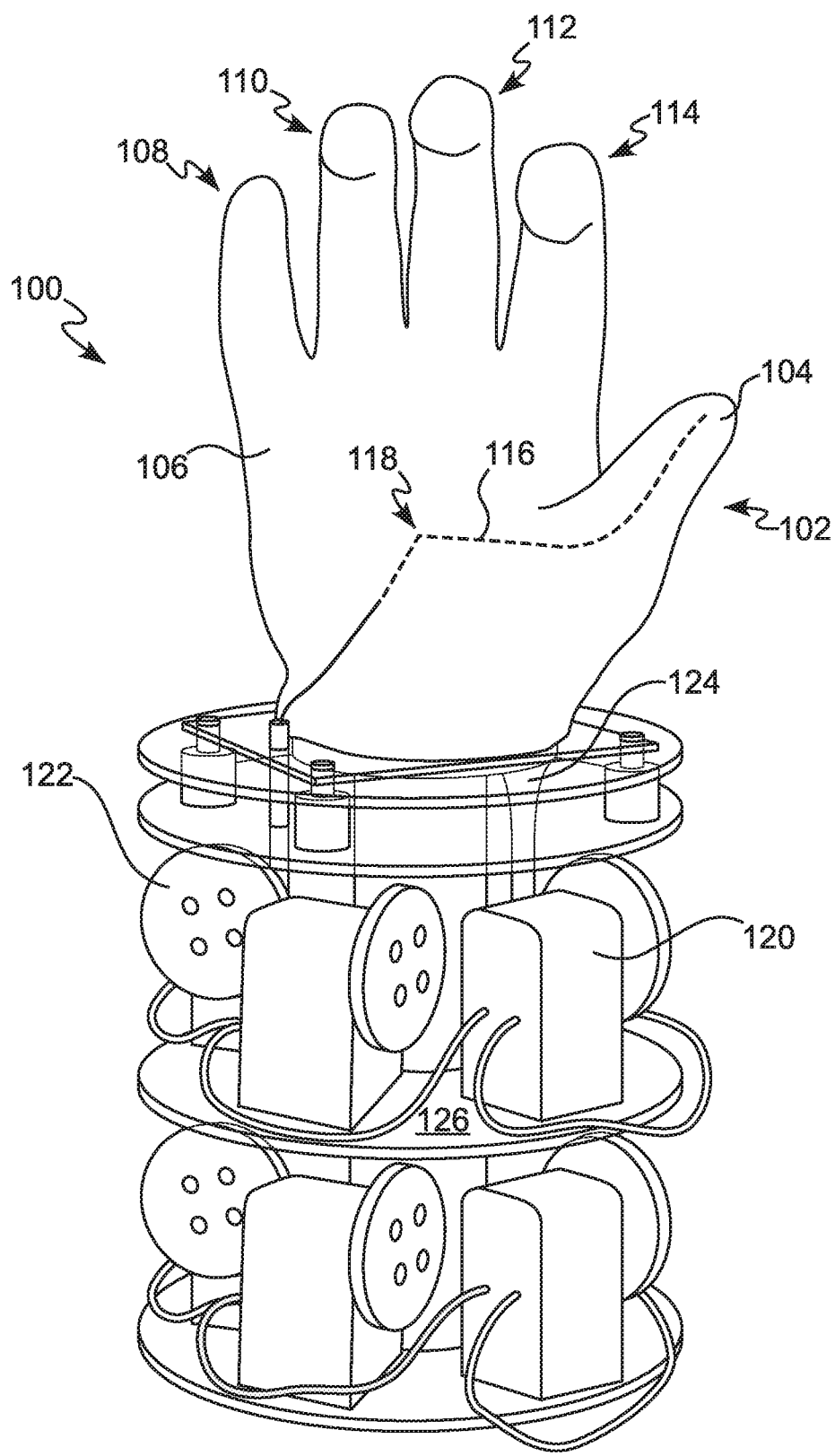
FIG. 1A is a front perspective view of a manipulation device according to a non-limiting embodiment.

For purposes of the description hereinafter, the terms "end," "upper," "lower," "right," "left," "vertical," "horizontal," "top," "bottom," "lateral," "longitudinal," and derivatives thereof shall relate to the embodiments as they are oriented in the drawing figures. However, it is to be understood that the embodiments may assume various alternative variations and step sequences, except where expressly specified to the contrary. It is also to be understood that the specific devices and processes illustrated in the attached drawings, and described in the following specification, are simply exemplary embodiments or aspects of the invention. Hence, specific dimensions and other physical characteristics related to the embodiments or aspects disclosed herein are not to be considered as limiting.

No aspect, component, element, structure, act, step, function, instruction, and/or the like used herein should be construed as critical or essential unless explicitly described as such. Also, as used herein, the articles "a" and "an" are intended to include one or more items and may be used interchangeably with "one or more" and "at least one." Furthermore, as used herein, the term "set" is intended to include one or more items (e.g., related items, unrelated items, a combination of related and unrelated items, and/or the like) and may be used interchangeably with "one or more" or "at least one." Where only one item is intended, the term "one" or similar language is used. Also, as used herein, the terms "has," "have," "having," or the like are intended to be open-ended terms. Further, the phrase "based on" is intended to mean "based at least partially on" unless explicitly stated otherwise.

As used herein, the term "communication" may refer to the reception, receipt, transmission, transfer, provision, and/or the like, of data (e.g., information, signals, messages, instructions, commands, and/or the like). For one unit (e.g., a device, a system, a component of a device or system, combinations thereof, and/or the like) to be in communication with another unit means that the one unit is able to directly or indirectly receive information from and/or transmit information to the other unit. This may refer to a direct or indirect connection (e.g., a direct communication connection, an indirect communication connection, and/or the like) that is wired and/or wireless in nature. Additionally, two units may be in communication with each other even though the information transmitted may be modified, processed, relayed, and/or routed between the first and second unit. For example, a first unit may be in communication with a second unit even though the first unit passively receives information and does not actively transmit information to the second unit. As another example, a first unit may be in communication with a second unit if at least one intermediary unit processes information received from the first unit and communicates the processed information to the second unit.

As used herein, the term "computing device" may refer to one or more electronic devices configured to process data. A computing device may, in some examples, include the necessary components to receive, process, and output data, such as a display, a processor, a memory, an input device, and a network interface. A computing device may be a mobile device. The computing device may also be a desktop computer or other form of non-mobile computer. An "interface" refers to a generated display, such as one or more graphical user interfaces (GUIs) with which a user may interact, either directly or indirectly (e.g., through a keyboard, mouse, touchscreen, etc.).

Reference to "a computing device" or "a processor," as used herein, may refer to a previously-recited computing device and/or processor that is recited as performing a previous step or function, a different computing device and/or processor, and/or a combination of computing devices and/or processors. For example, as used in the specification and the claims, a first computing device and/or a first processor that is recited as performing a first step or function may refer to the same or different computing device and/or a processor recited as performing a second step or function.

As used herein, the term "application programming interface" (API) may refer to computer code that allows communication between different systems or (hardware and/or software) components of systems. For example, an API may include function calls, functions, subroutines, communication protocols, fields, and/or the like usable and/or accessible by other systems or other (hardware and/or software) components of systems.

In non-limiting embodiments, a flexible manipulation device is provided with flexible (e.g., semi-rigid, soft, compliant, etc.) appendages to allow for robotic manipulation of an object. For example, the manipulation device and system described herein may be used to robotically grip or otherwise manipulate an object. Non-limiting embodiments may be used in pediatric and/or elderly care, for example, where a soft touch may be necessary to avoid damage or bruising. Non-limiting embodiments may also be used for handling produce (e.g., picking produce from a plant, transferring produce, or the like), especially soft fruits and vegetables (e.g., berries, tomatoes, etc.) and leafy foods (e.g., lettuce, kale, etc.). Non-limiting embodiments may also be used for entertainment purposes (e.g., toys such as action figures or toy robots), in-home robotics (e.g., automating tasks, assisting disabled individuals, etc.), manufacturing (e.g., human-robotic interaction and collaboration), military and defense (e.g., bomb diffusing robots, etc.), and/or the like, and may be used locally (e.g., controlled at the source of the manipulation device) or remotely (e.g., via tele-operation). It will be appreciated that the manipulation device and system described herein may be used for any suitable purpose.

Non-limiting embodiments provide a mapping, using artificial neural networks and/or other techniques, from a desired pose of the manipulation device to actuations of tendons that will result in that desired pose. Through the use of flexible (e.g., semi-rigid) materials, a variety of different tendon placement locations and patterns, and the possibility of numerous geometries for the manipulation device, a manipulation device may be fabricated and trained for task-specific actuations are to allow for intuitive direct control.

Non-limiting embodiments improve upon existing, rigid manipulation devices because of the versatility of a tendon-driven, flexible manipulation device. For example, using such a manipulation device provides an increased margin of error in applying pressure to an object during manipulation (e.g., grasping an object). Non-limiting embodiments may be used to grasp an object in a manner having the benefits of both a suction grasper and a hand grasper, enabling for an object such as a piece of fruit to be grasped and pulled away from a plant with enough pull-out force to separate it, but without bruising the fruit. Moreover, because of the different types of materials that may be used to form the manipulation device and the ease of changing the tendon routings to achieve different results, fabrication costs are relatively low compared to rigid manipulation devices.

Referring now to FIG. 1A, a front view of a manipulation device 100 is shown according to a non-limiting embodiment. The manipulation device 100 includes a plurality of appendages 102, 108, 110, 112, 114 extending from a base 106. In the example shown in FIG. 1A, the manipulation device 100 is in the form of a human hand where the base 106 includes a palm and the five (5) appendages are fingers that extend outwards from the base, although it will be appreciated that the manipulation device 100 may take on any number of forms (anthropomorphic or non-anthropomorphic) with any number of appendages. For example, the manipulation device 100 may be a planar gripper, a three-fingered hand, a four-fingered hand, and/or any other arrangement.

Still referring to FIG. 1A, in non-limiting embodiments, the base 106 and appendages 102, 108, 110, 112, 114 are formed from a foam material. However, a plurality of different flexible materials, such as semi-rigid materials, may be used. For example, foam, silicone, one or more elastomers, polydimethylsiloxane, rubber, plastic, biological materials, nanomaterials (including self-restoring materials), cork, compressed textiles, plush material, any material having a low elastic modulus, and/or the like may be used to form the manipulation device 100. In non-limiting embodiments, the manipulation device 100 includes a skin, such as a glove or coating, In non-limiting embodiments, the manipulation device includes a skin that covers at least a portion of the manipulation device, such as one or more appendages of the manipulation device. The skin may be used to connect (e.g., attach) the tendons and/or may be used to cover the tendons or portions of the tendons. In some examples, the skin may be a glove (e.g., a knitted glove) or any other material. In some examples, the skin may be laminated to the manipulation device to prevent slippage using a spray adhesive or other like product. In some non-limiting embodiments, a knitting machine may produce a custom-fit skin based on a 3D model. However, it will be appreciated that the material used to form the manipulation device 100 may also be used without any skin. In some non-limiting embodiments, a hybrid of materials may be used having different material properties, such as a different rigidity or firmness.

With continued reference to FIG. 1A, a first appendage 102 includes an end portion 104, which may include a distal end of the appendage 102 and/or any other portion of the appendage 102 that extends away from the base 106. As an example, an end portion 104 may include a fingertip. In some non-limiting embodiments, the fingertip may include a different material than the rest of the appendage and/or base, such as a firmer (less flexible) material or a softer (more flexible) material to provide protection during usage. The different material may also be a tip or covering of the appendage portion. A tendon 116 is connected to the end portion 104 and to the base 106. A tendon 116 may be connected to a surface and/or internal point on the end portion 104, as an example. A first end of the tendon 116 may be connected to the end portion 104. The tendon 116 may be passed through one or more portions of the appendage 102 (e.g., being threaded and/or looped through a skin and/or a material structurally forming the appendage 102). The tendon 116 may be passed through a portion of the appendage 102 below the end portion 104 and above the base 106. The tendon 116 may also be passed through one or more portions of the base 106. As used herein, the term "tendon routing" may refer to a configuration of a tendon, such as connection points, locations along a surface model or physical manipulation device, patterns, locations of the base and/or appendage through which a tendon passes through, and/or the like.

In the example shown in FIG. 1A, the tendon 116 is passed through a particular portion 118 of the base 106 after which the tendon 116 connects to one or more actuation devices configured to actuate (e.g., pull, wind, unwind, add or release tension, or the like) the tendon 116. Other than points of connection, such as the connection of the tendon 116 to the end portion 104 in which the tendon is fixed with a knot, adhesive, or in some other manner, the tendon 116 passes through other portions of the manipulation device such that the tendon can contract and extend independent of those portions of the manipulation device. For example, by being threaded through a portion of the appendage 102, the tendon 116 can slide through that portion during actuation based on the amount of friction. Material to lessen the friction, such as one or more tubes or coatings, may be used at such portions of the appendage and/or base.

In non-limiting embodiments, and still referring to FIG. 1A, the tendon 116 may be a string, cable, wire, and/or the like. The tendon 116 may be fibrous, metallic, plastic, rubber, and/or the like. For example, the tendon 116 may be a polytetrafluoroethylene (PTFE) coated cable, such as a braided fishing line, in some non-limiting examples. The tendon 116 material may be chosen based on one or more properties such as elasticity, stiffness, slack, strength, bend radius, friction, and/or the like. The tendon 116 material may include a coating (e.g., PTFE or the like) to lessen friction and to provide smooth actuations. In non-limiting embodiments, the manipulation device may include both flexor tendons and extensor tendons, where one or more flexor tendons (e.g., tendon 116) configured to contract one or more appendages correspond to one or more extensor tendons (shown in FIG. 1B) configured to revert the manipulation device 100 back to a resting pose. A resting pose may refer to a default configuration of the manipulation device, including base 106 and appendages 102, 108, 110, 112, 114, when the tendon(s) are not being actuated. A resting pose may be any number of configurations and forms depending on the intended use of the manipulation device 100.

In non-limiting embodiments, and still referring to FIG. 1A, the actuation device includes one or more motors 120 (e.g., servo motors or the like), one or more tubes 124 (e.g., for aligning the tendon 116), and one or more winches (e.g., for winding and/or unwinding). With such an arrangement, the tendon 116 may pass through one or more tubes 124 (e.g., for aligning the tendon 116 and/or minimizing friction) and connect to one or more winches 122 (e.g., for winding and/or unwinding). In such examples, the winches 122 are powered by the motor 120 (e.g., a servo motor or the like). In the non-limiting example shown in FIG. 1A, the actuation device is mounted on a platform base 126, which may be constructed from any material such as acrylic, metal, and/or the like. Additional mounting points may be placed on the platform base 126 such that the tubes 124 can be fixed. In non-limiting embodiments, rigid mechanical components, such as all or part of the actuation device, may be located and/or housed away from the appendage and base 106. It will be appreciated that various types of actuation devices and arrangements may be used, such as one or more pistons, to actuate the tendons.

In some non-limiting embodiments, one or more rigid mechanical components may be housed inside the material comprising the base 106 and/or appendage, such that the material of the base or appendage softens the components. In some non-limiting embodiments, soft actuators may be used such as artificial muscles.

Figure 1B:
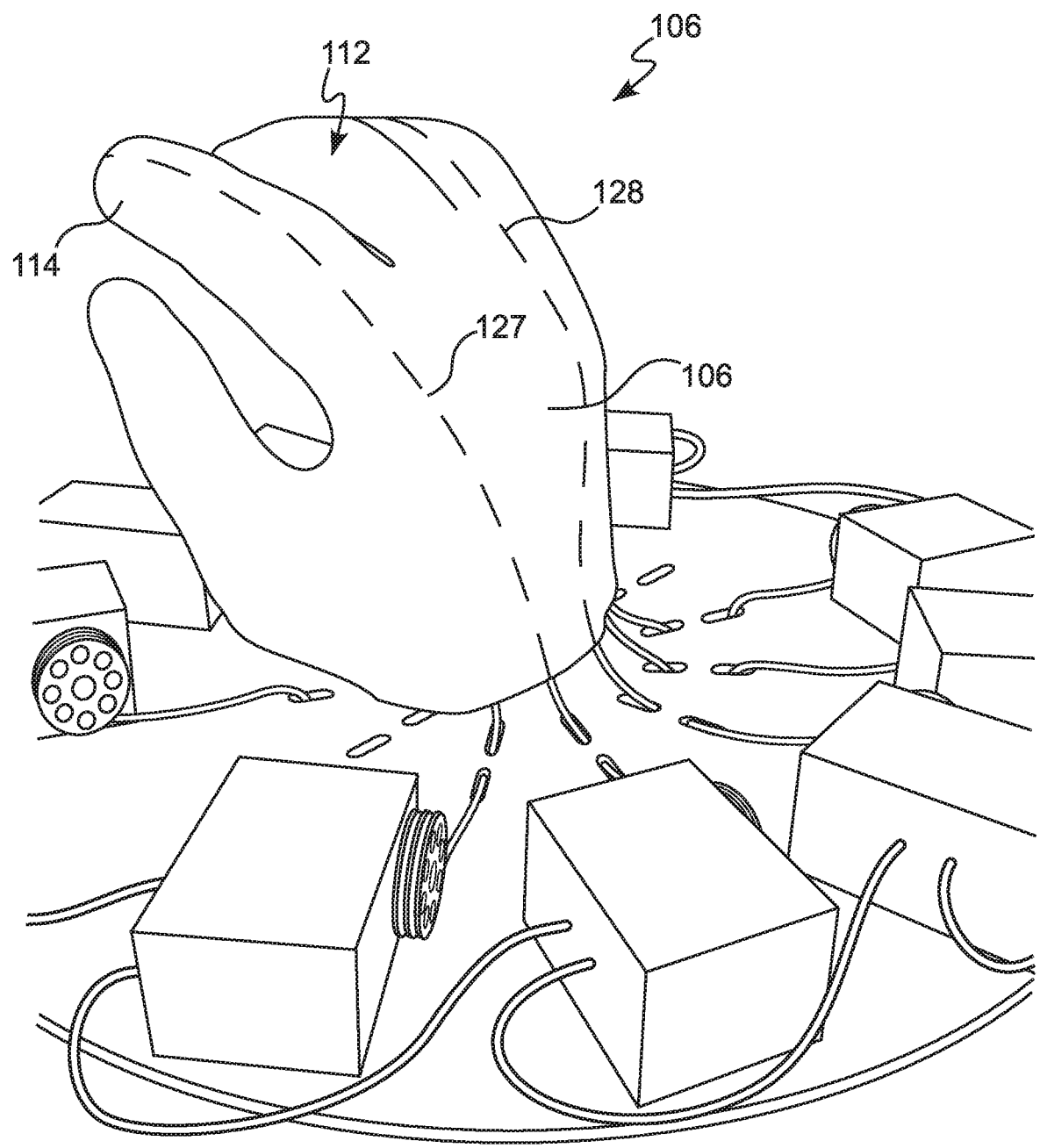
FIG. 1B is a back perspective view of a manipulation device according to a non-limiting embodiment.

Referring now to FIG. 1B, a back view of a manipulation device 100 is shown according to a non-limiting embodiment. The view in FIG. 1B shows tendons 127, 128 connected to appendages 114, 112, respectively. The tendons 127, 128 are shown connected to and passing through a back side of appendages 114, 112 and having a tendon routing passing though portions of the base 106 (e.g., the back of the hand), and extending to an actuation device as described above. The tendons 127, 128 shown in FIG. 1B may include extensor tendons configured to actuate and form the manipulation device back into a resting pose. Such extensor tendons counteract actuations and deformations resulting from the flexor tendons (e.g., 116 in FIG. 1A) on the front side of the manipulation device 100.

The manipulation device may be formed in any number of ways from one or more flexible materials. For example, in non-limiting embodiments the manipulation device may be cast from a human hand. This process may involve, for example, casting a hand in alginate to create a mold, pouring plaster into the alginate mold and curing, forming a two-part silicone mold from the plaster, and filling the mold with foam to cast a flexible manipulation device. It will be appreciated that various other processes and materials may be used. The initial pose of the manipulation device may be its resting pose, without any tension applied to the appendages.

In non-limiting embodiments, the tendons may be connected to the manipulation device based on the results of simulations. The tendons may be sewn into the manipulation device using a needle and fixed at the end portion of each appendage with a knot. However, the tendons may be connected to the manipulation device in any other way such as, for example, adhesively. The tendons may pass through a portion of the appendage and/or base by being threaded through such a portion.

Figure 2:
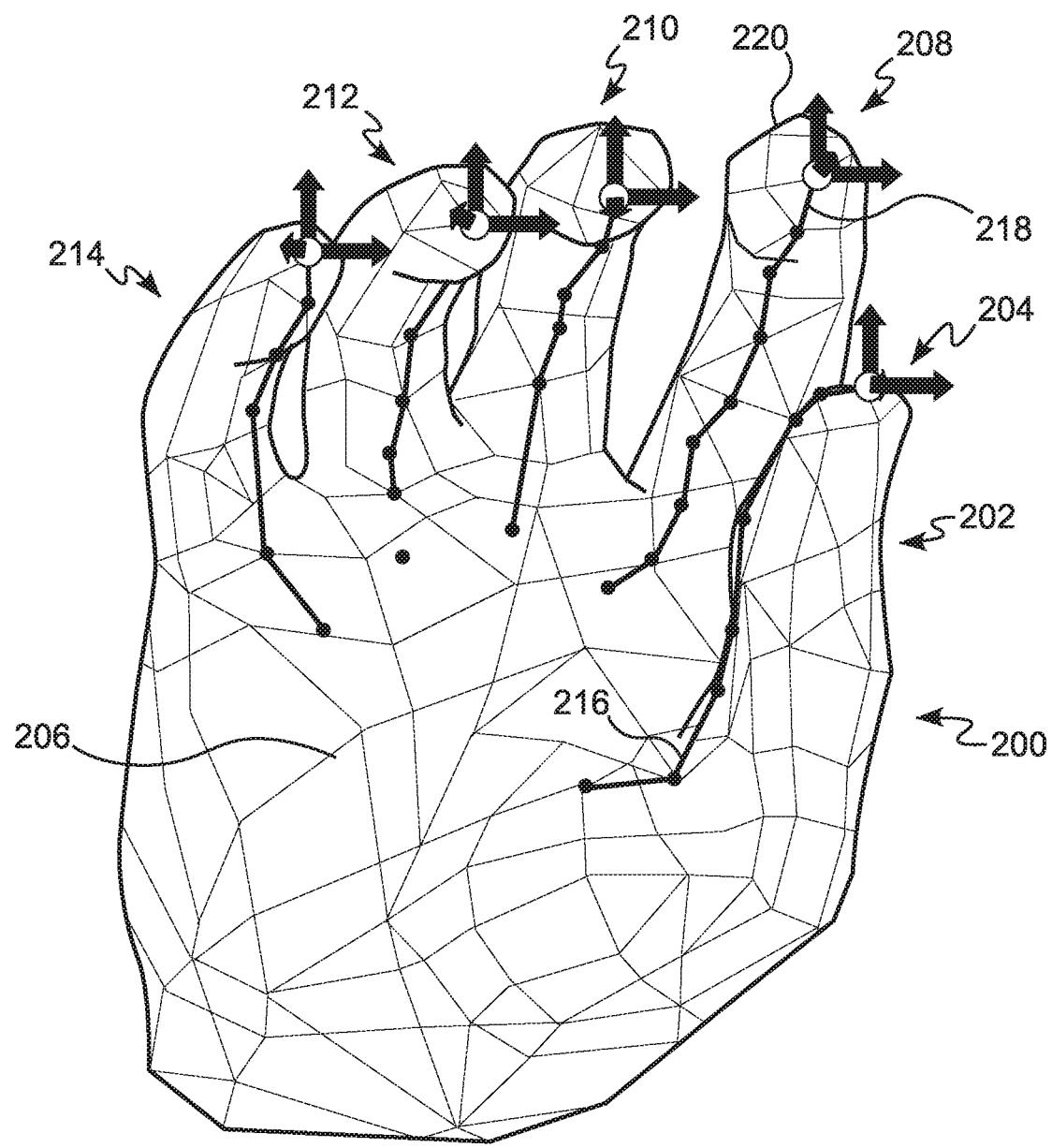
FIG. 2 is a three-dimensional model for a manipulation device according to a non-limiting embodiment.

Referring now to FIG. 2, a three-dimensional (3D) model 200 of a manipulation device is shown according to a non-limiting embodiment. The model 200 may be generated in any number of ways such as, for example, a 3D scanner, a plurality of images processed with an image processing application, and/or the like. In some examples the model 200 may be created to print or mold the manipulation device and may already exist as a tetrahedralized object file or any other 3D data representation of the surface boundary. The model 200 includes a base 206 and simulated appendages 204, 208, 210, 212, 214. The model 200 also includes simulated tendons connected to each appendage (e.g., tendon 216 connected to appendage 202). Each appendage also includes a feature point (e.g., feature point 204 for appendage 202) at which the simulated tendon 216 connects. The feature points in FIG. 2 are displayed with an orientation indicator showing x- and y-axis orientations.

In non-limiting embodiments, the model 200 may be generated by capturing a plurality of photographs (e.g., 50 photographs) uniformly spaced around the hand (or other object to be modeled) and processing the photographs with a software application to perform the reconstruction and provide a data output representing a surface boundary of the manipulation device. For example, Autodesk ReMake may be used. A 3D finite element mesh of the model may then be generated. In non-limiting embodiments, to lessen processing requirements, a simplified version of the mesh may be used by performing a decimation step. The model 200 used for the simulations may be performed using a Finite Element Method Simulator (FEMSim), which models a 3D discretized soft object with tendons that run along the skin of the object. These may can be contracted, and the resulting lowest energy pose (e.g., resting pose) of the manipulation device is determined.

In non-limiting embodiments, and with continued reference to FIG. 2, a user may manipulate the model 200 to modify one or more parameters. For example, a GUI may be presented to the user to interact with the model using one or more input devices, such as a touchscreen, mouse, keyboard, motion capture system, and/or the like, and one or more software tools, such as selection tools, rotation tools, zoom tools, and/or the like. Using the software tools, a user may change the location of the feature points (such as feature point 204) for one or more appendages. The feature points shown in FIG. 2 are located on an end portion of the appendage. However, a user may identify other feature points along an appendage and/or base 206 to specify additional points of connection for a simulated tendon and/or to identify portions of the appendage and/or base for the simulated tendon to pass through. For example, a user may select a location on the appendage of the model 200 (e.g., one or more points on the surface of the appendage of the model 200 or within the space defined by the model 200 object) for generating a simulated tendon.

The GUI(s) presented to the user may provide software tools to allow users to select nodes representing the geometry of the 3D model and, using the nodes, drag the mesh into different configurations to create target poses and different geometries. The GUI(s) may also provide software tools to allow a user to select a set of notes along which tendons are routed, and to add, alter, and/or remove tendons from the design. A user may also be provided with software tools through the GUI(s) to create motions by contracting tendons, including tools to record different contractions and play-back the recorded sequences. The GUI(s) may also provide software tools to change one or more material properties of the tendons, such as elasticity, strength, and/or friction coefficients.

Each manipulation device may be modeled as a discrete set of nodes denoted as X for the non-deformed device (e.g., in a resting pose) and x as the statically stable deformed pose, using modeling techniques for modeling a spring. The total deformation energy of the system may be defined as: $E=E_{material}+E_{contractile}+E_{pins}$, where $E_{material}$ is the energy due to deformations of the simulation mesh, $E_{contractile}$ is the strain energy stored by the contractile elements (e.g., tendons), and $E_{pins}$ models the behavior of stiff springs that connect a small number of simulation nodes to world anchors in order to eliminate rigid body modes. The elastic behavior of the material may be modeled using linear finite elements with a compressible Neo-Hookean material model.

Tendons may be modeled as contractile elements that abstract the contraction of a tendon as changing the rest length of an underlying unilateral spring model. A contractile element is defined as a piecewise linear curve with two endpoints $(x_s, x_t)$ and n intermediate vertices $(x_1, \ldots, x_n)$. Assuming that all points of contractile elements are bound to nodes of the simulation mesh, the initial rest length $l_0$ of a tendon is defined by the sum of distances between the vertices as:

$$l_0 = \|x_s - x_1\| + \sum_{i=1}^{n-1} \|x_i - x_{i+1}\| + \|x_n - x_t\|$$

The contraction level ac of each tendon describes the contracted length as:

$$l_0 = l_0(1-\alpha_c).$$

The resulting deformation for a tendon routing with the contractions ac is calculated by minimizing the total energy of the system.

In non-limiting embodiments, a plurality of simulated actuations of one or more simulated tendons 216 is performed based on the location of the feature points. As an example, a motion capture system (e.g., a Cyberglove, a video-based motion capture system, a plurality of sensors arranged on a user, etc.) may be used to capture the physical pose of an individual's hand or a physical model of a hand. A user may then be prompted, during a training phase, to imitate a plurality of different poses shown through a GUI or otherwise presented to the user. Each pose may be repeated a predetermined number of times (e.g., five (5)) for generalization. The poses used for training may be selected based on the intended use and implementation of the manipulation device. For example, in some non-limiting embodiments, the simulated model may not generalize well for coupled motions and the ends of opposing appendages (e.g., opposing fingertips for non-limiting embodiments using a human-like hand) may not touch or align. Therefore, using selected poses that include coupled tendon contractions from multiple appendages may increase generalization of the model and the accuracy of the system.

In some non-limiting embodiments, the simulated tendon actuations may be performed without a motion capture system. In non-limiting embodiments, a manipulation device configured with at least one tendon may be in communication with the computing device performing the modeling and/or simulation tasks. Actual tendon actuations may be performed with the manipulation device having known connection points for the tendons. The locations of each feature point (e.g., an end of the appendage and/or other portions of the appendage and/or base) may be recorded through the computing device to provide sample data. It will be appreciated that sample data may be generated in numerous ways.

In non-limiting embodiments, the sample data is partitioned into a testing data set and a training data set. Each of the feature points may be used to form input vectors for inputting into a fully connected feed-forward artificial neural network (ANN). The tendon actuations may be used to form output vectors in the ANN. The ANN may then be trained using the training data set. The ANN may be used to solve the inverse kinematics problem for a tendon-activated flexible manipulation device in simulation. The ANN may be implemented in two stages: training and prediction. The ANN may be supervised or unsupervised.

To train the ANN to predict tendon actuations U given feature point locations X, the ANN is taught to map X to U. Therefore, the training stage may involve providing the ANN numerous (e.g., hundreds or more) of X to U mappings that are known to be accurate. The tendon actuation space may be sampled by iterating through numerous possible combinations of tendon activations with a certain step size. Sampling the space takes s samples, where s is the number of sample actuations per tendon and t is the number of tendons. As an example, 1,024 samples may be used for sample data, although it will be appreciated that fewer or more samples may be collected and used. The sample data set may be partitioned such that the testing data set has less data than the training data set. In a non-limiting embodiment, 90% of the sample data is partitioned into a training data set and written to a training file, while 10% of the sample data is written to a testing file to form a testing data set. Various other ratios are possible. Partitioning the sample data into the two data sets may be performed randomly. The training data set is used to train the network, while the testing data set is used to evaluate the network and test for problems such as overfitting.

In non-limiting embodiments, the ANN may have 4 or 5 layers, as an example, each of which may contain 30 nodes, also as an example. The rectifier activation function may be used in non-limiting embodiments. The neural network may be trained for 300 or 400 epochs (e.g., learning steps), as an example, using the training data set and may use various batch sizes (e.g., 20 epochs). An Adam optimizer may be used in non-limiting embodiments. The ANN may be implemented using an API for TensorFlow, such as Keras. The data sets may be used to train and test the ANN and then evaluate the resultant loss, which is a measure of the inaccuracies of the prediction.

In non-limiting embodiments, during simulation, tendon actuations (and corresponding actuations of attached appendages) are simulated in real-time given the inputted feature point locations for the simulated tendons, using file input/output to communicate with an instance of the ANN. For example, the location(s) of the desired feature point(s) may be communicated to the ANN as an input and the ANN may output the predicted simulated tendon actuations, which are in turn utilized to modify the appearance of the 3D model of the manipulation device and/or to control a physical manipulation device in communication with the computing device. The tendon actuations may be represented by values of estimated tendon contractions, and may be linearly mapped to contraction lengths which may be used to proportionally operate the actuation device (e.g., rotate the winches to wind or un-wind the tendons) accordingly to control the physical manipulation device in real-time.

To create a complex range of motions, a high number of samples may be used during the training stage of the neural network. In non-limiting embodiments in which the manipulation device includes both flexor tendons and extensor tendons, one or more pairs of flexor tendons and extensor tendons for an appendage may be treated as a single unit. In order to move each appendage inwards (e.g., towards the front side of the base, such as a palm of a hand) and outwards (e.g., away from the base), each appendage has at least one flexor tendon and one extensor tendon. Several samples per tendon (e.g., a fully actuated sample, a halfway actuated sample, and a sample with no actuation) may be selected. This setup requires $s'=3^{10}=59,049$ samples, in an example with five appendages having a total of ten tendons (e.g., three samples for each of the ten tendons). To reduce the number of samples required for training, each extensor and flexor tendon pair may be treated as a single unit that may hold values ranging from fully flexed to fully extended. Flexor tendons and extensor tendons may be merged in this way because they are not likely to be used at the same time (e.g., there is no co-contraction performed with any given appendage). By coupling flexor and extensor tendons, $(2s)^{t/2}$ samples are used such that, if there are three samples per tendon, a total of $(2s)^{t/2}=6^5=7,776$ samples are used, reducing processing requirements.

Figure 3:
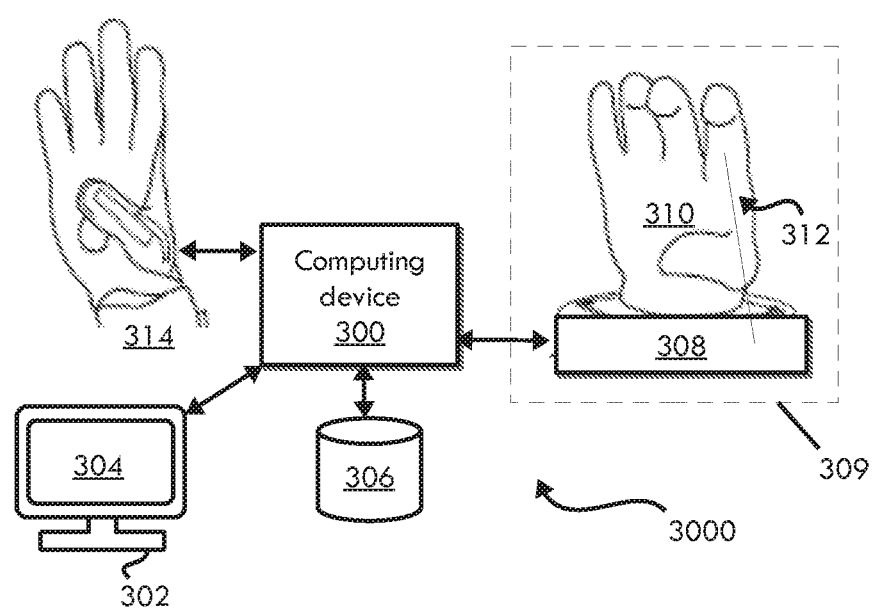
FIG. 3 is a schematic diagram for a system for simulating and using a manipulation device according to a non-limiting embodiment.

FIG. 3 shows a schematic diagram for a system 3000 for simulating and using a manipulation device 309 according to a non-limiting embodiment. The manipulation device 309 includes an actuation device 308 in communication with a computing device 300. The actuation device 308 is configured to actuate one or more tendons (e.g., tendon 312) connected to a manipulation portion 310 (e.g., one or more appendages) of the manipulation device 309. The computing device 300 may include a single computing device or, in other examples, may include a plurality of separate computing devices for performing different tasks. The computing device 300 may be configured to cause the actuation device 308 to actuate one or more tendons 312 of the manipulation device 309. For example, the computing device 300 may communicate instructions to the actuation device 308 to contract or extend a tendon 312 by a specified length.

With continued reference to FIG. 3, the system 300 may also include a control device 314, such as a CyberGlove, for controlling actuation of the manipulation device 309. The control device 314 may include any suitable input device for specifying one or more poses for the manipulation device 309. The control device 314 may be in communication with the computing device 300. The computing device 300 is also in communication with a display device 302 that presents one or more GUIs 304 for user interaction. A user may interact with the GUIs 304 to control the manipulation device 309, to simulate actuations of a simulated actuation device displayed on the GUIs 304, and/or to modify one or more parameters of a simulated manipulation device (e.g., a geometry of the manipulation device, one or more tendon placements of the manipulation device, and/or the like). The control device 314 may also be used to control simulations that are displayed on the GUIs 304 and may not directly control the manipulation device 309.

Still referring to FIG. 3, the computing device 300 is in communication with a data storage device 306. The data storage device 306 may store mappings between tendon actuations and poses, including one or more ANNs, such that the computing device 300 can output predicted tendon actuations based on inputted feature points. The data storage device 306 may store testing data, training data, recordings of simulated actuations, and/or other like data.

With continued reference to FIG. 3, the control device 314 may be used to remotely control the manipulation device 309 over a network. For each manipulation device implementation, including a type of actuation device, the maximum tendon displacement is identified manually and used to normalize the tendon actuation levels that correspond to the software-driven control. Communication with the actuation device 308 may be facilitated using the robot operating system (ROS) and the Dynamixel SDK, as examples, although various other software and/or hardware tools may be used. Due to different kinematics of the human hand and a manipulation device 309, a suitable mapping may be created between the 22 joint angles from a CyberGlove and the actuations of the ten (10) tendons (in an example with five appendages each having two tendons) of the manipulation device. In order to obtain such a mapping, a sampling of tendon actuations is used to execute various poses of the manipulation device. An operator may imitate those poses while wearing the calibrated CyberGlove, and the corresponding joint angles of the human hand pose may be recorded.

A training data set may be generated with both random tendon actuations and tendon actuations corresponding to finger-thumb oppositions and grasping postures. Additionally or alternatively to implementing an ANN, a regression model may be developed and trained by inputting the 22 joint angles from the CyberGlove or other input device as input and predicting the corresponding tendon actuation levels. As an example, the regression model may use Kernel Ridge Regression with a linear kernel. In testing a non-limiting embodiment utilizing a regression model, an average RMS error achieved by the model between the measured and the predicted tendon actuations was 0.0026, with tendon actuations having a range of zero to one. Even with a small training set (120 poses), the learned model was able to reproduce a variety of poses with high accuracy.

In non-limiting embodiments, additionally or alternatively to using an ANN or regressive model, other modeling techniques may be used that process, as input, concatenated (or otherwise combined) tendon placement positions and output the tendon actuation that is expected to pose the hand correspondingly. For example, in non-limiting embodiments, a nearest neighbor technique may be used as a straw-man approach by identifying the tendon actuation of the pose that is nearest to the desired pose based on Euclidean distance (e.g., in a space defined for the poses) and returns that tendon actuation as the result. In non-limiting embodiments, deep reinforcement learning is used instead of a nonlinear model. In such embodiments, a deep deterministic policy gradient algorithm is combined with hindsight experience replay. The shaped reward function is the negative of the average distance error over all appendages. Hindsight experience replay may be used as a way to include additional targeted results, because failed solutions are reinterpreted during learning as successful solutions to a different problem.

Figure 4:
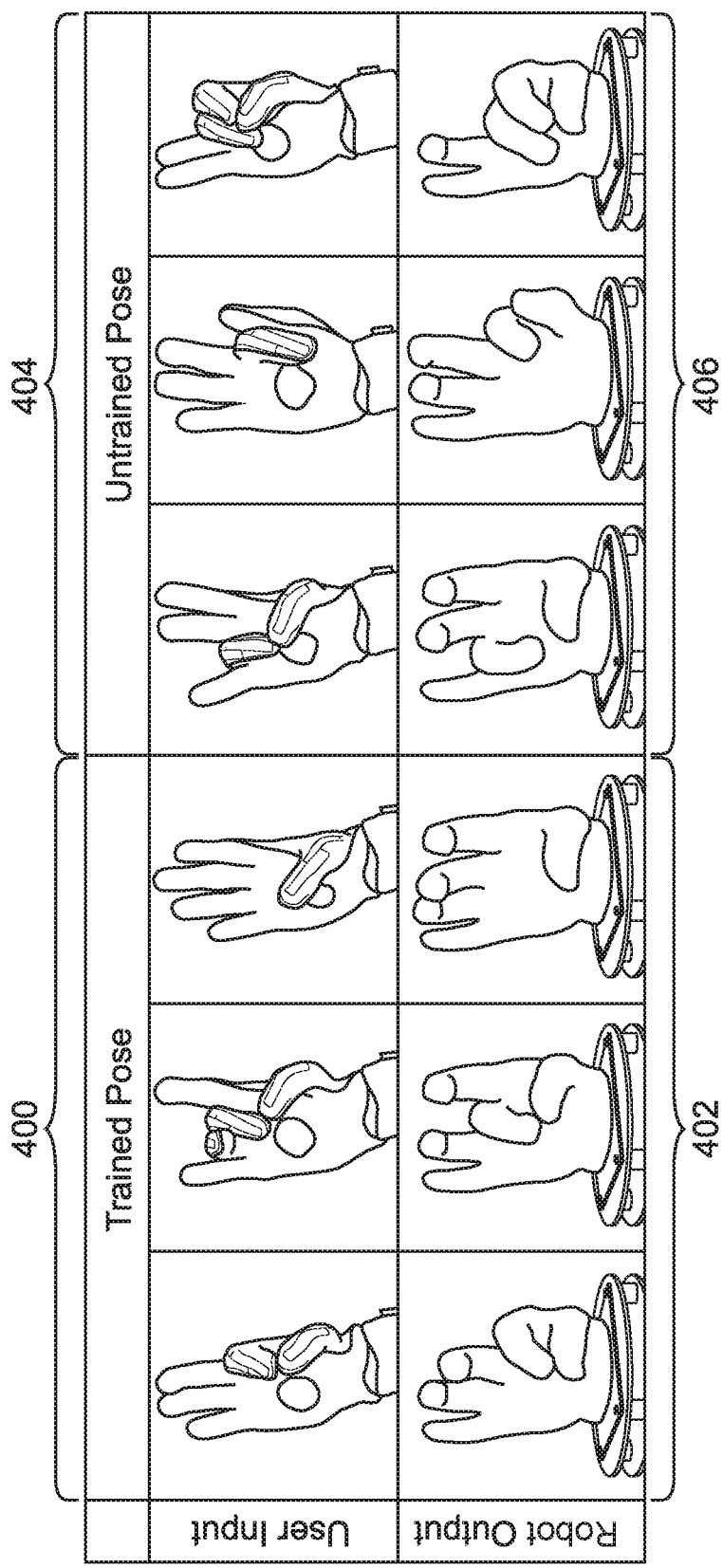
FIG. 4 is a table showing user input and robotic manipulation device output based on a plurality of trained poses and untrained poses according to a non-limiting embodiment.

Referring now to FIG. 4, a table is shown with user input and robotic manipulation device output based on a plurality of trained poses and untrained poses according to a non-limiting embodiment. The user input poses 400 correspond to robotic manipulation device output poses 402 in training. For example, the user input poses 400 may be performed by a user and captured with a motion capture device during a training phase to control the manipulation device and cause the robotic manipulation device output poses 402. The table also shows user input poses 404 that were not trained during a training process and the resulting robotic manipulation device output poses 406.

Figure 5A:
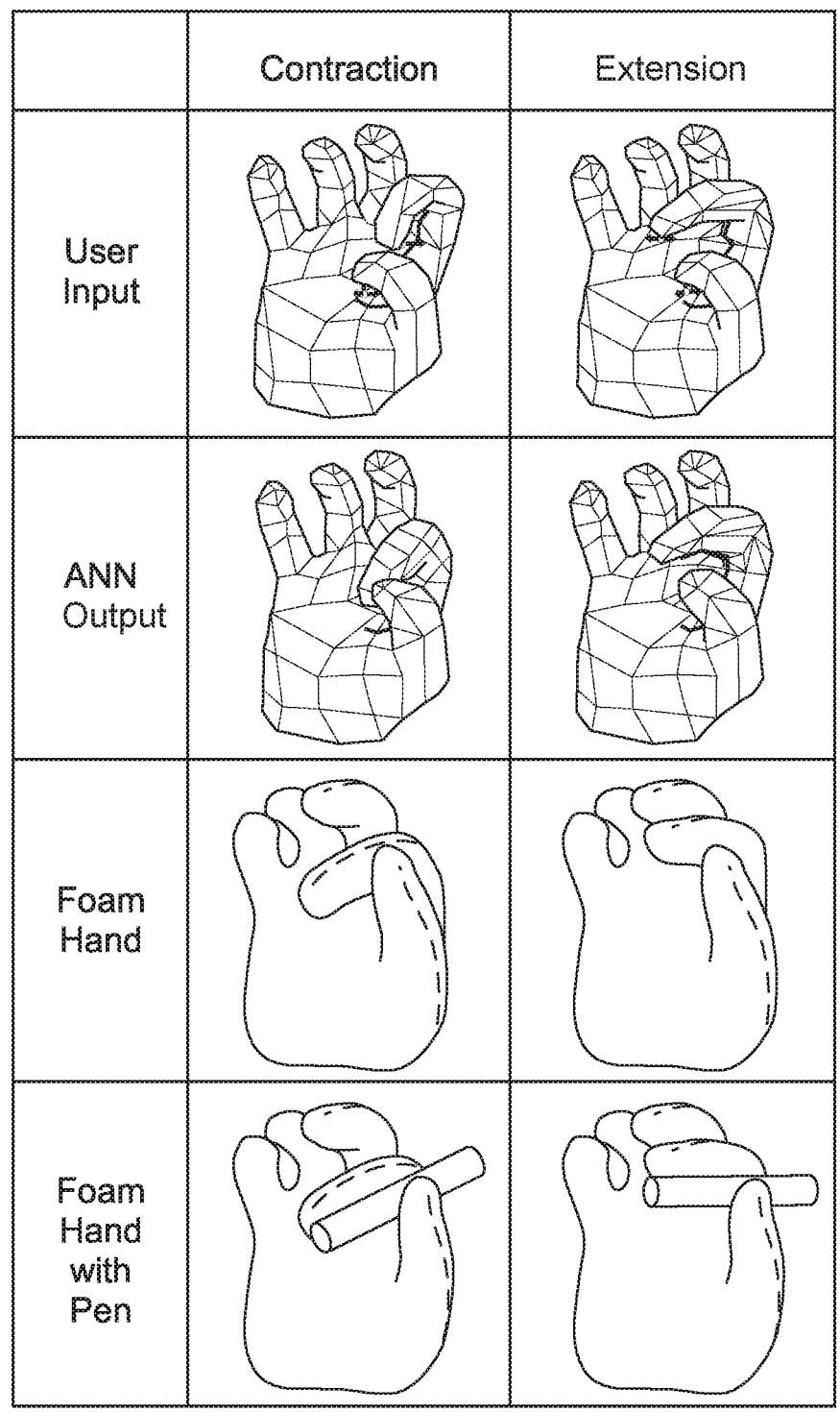
FIGS. 5A and 5B are tables showing user input, neural network output, and robotic manipulation device output according to a non-limiting embodiment.
Figure 5B:
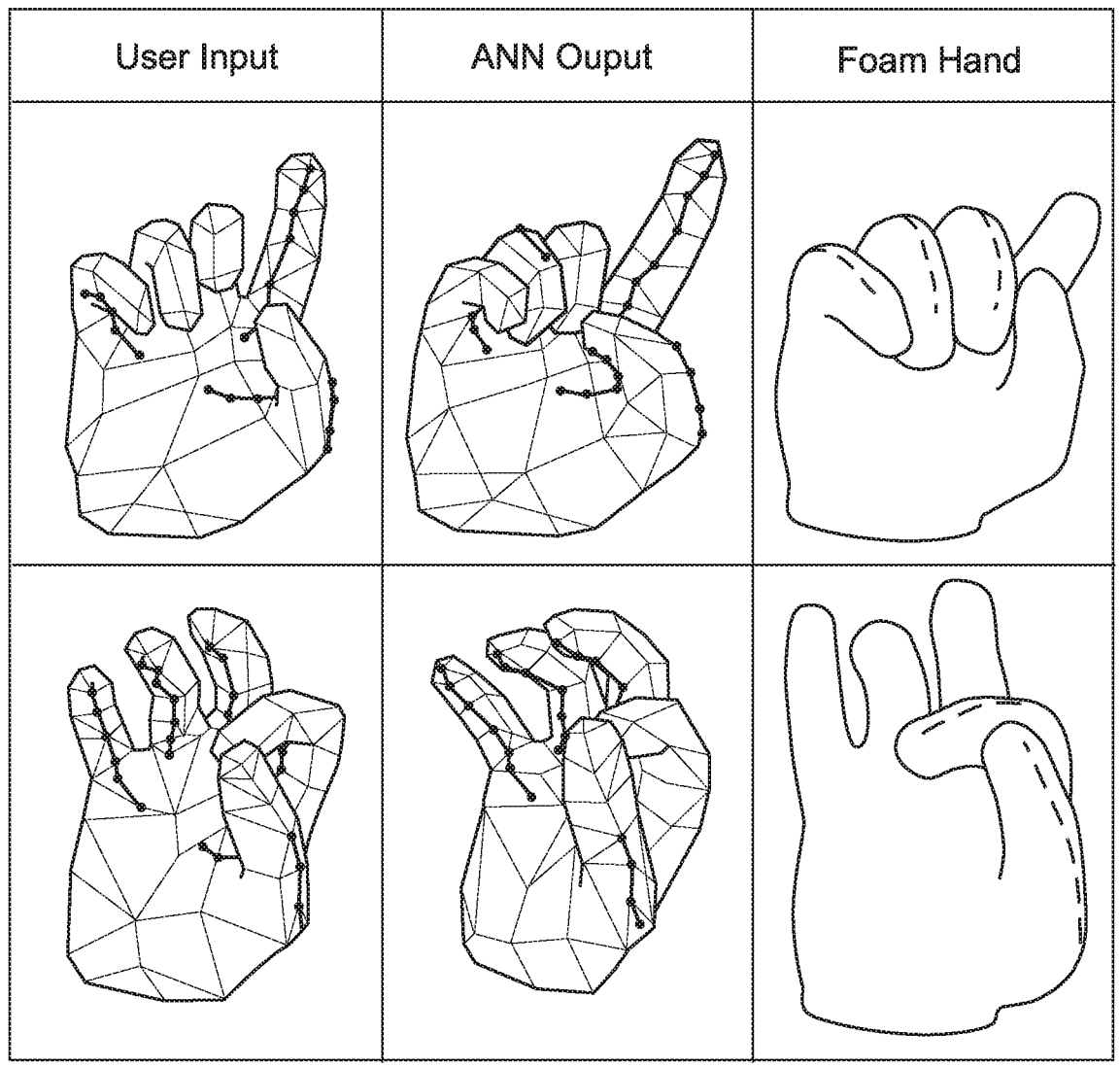

Referring now to FIGS. 5A and 5B, tables are shown with user input, neural network output, and robotic manipulation device output according to a non-limiting embodiment.

Figure 6:
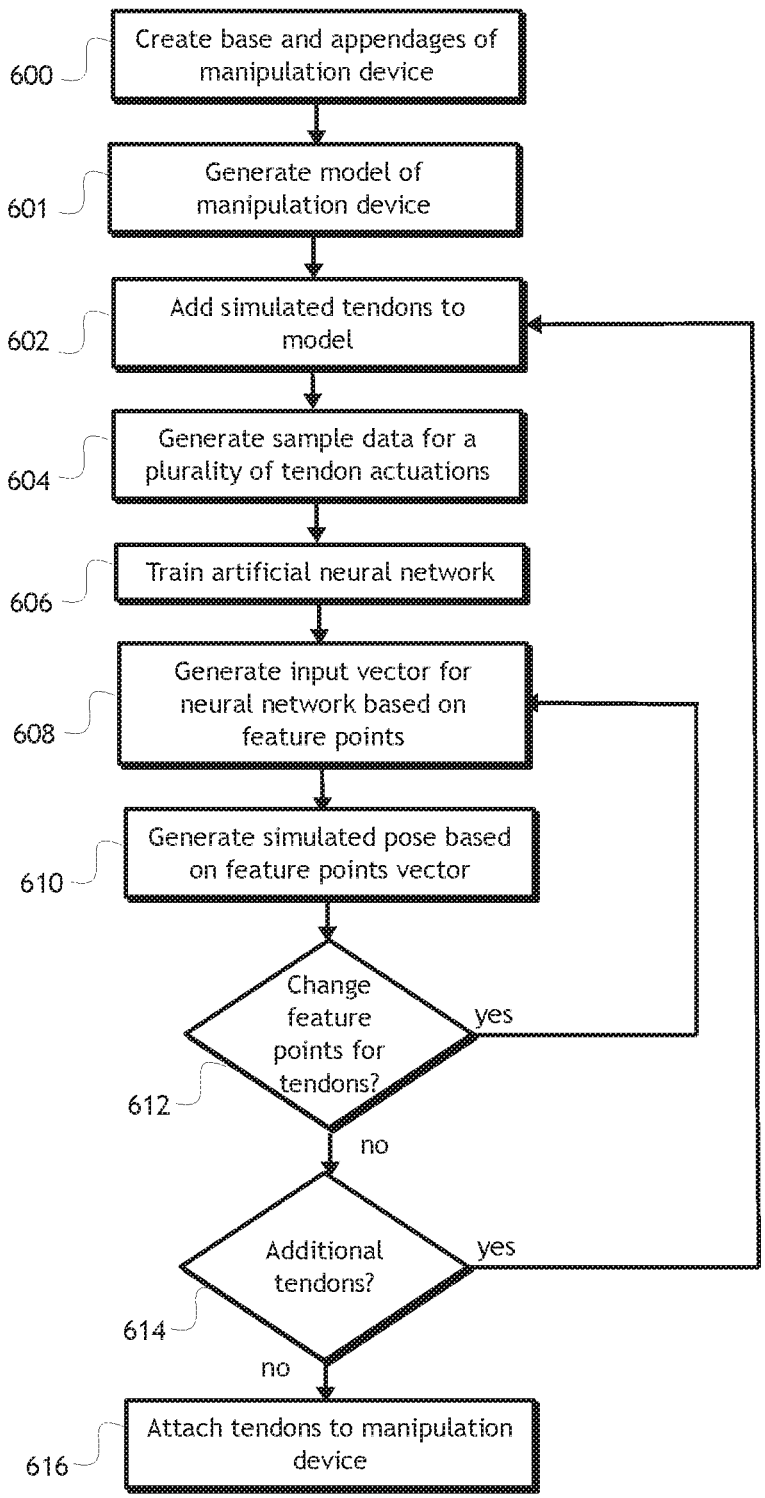
FIG. 6 is a flow diagram for a method of fabricating a manipulation device according to a non-limiting embodiment.

Referring now to FIG. 6, a flow diagram for a method of fabricating a manipulation device is shown according to a non-limiting embodiment. It will be appreciated that the steps shown in FIG. 6 are for exemplary purposes only and that fewer, additional, and/or different steps, and/or a different order of steps, may be used in non-limiting embodiments. The method shown in FIG. 6 starts at step 600, in which a manipulation device is formed having a base and one or more appendages. As described herein, the manipulation device may be formed in various ways, such as casting or 3D printing, with a variety of different flexible materials, such as foam. At this point, tendons may be provisionally connected to one or more appendages and an actuation device, although the tendons may not be connected in such embodiments until simulations are performed. At step 601, a 3D model of the manipulation device is generated by a computing device. As described herein, various methods for generating the manipulation device model may be used. The 3D model may be presented through one or more GUIs with one or more user tools for interacting with the model.

With continued reference to FIG. 6, at step 602 simulated tendons are added to the 3D model based on user input. For example, a user may select one or more feature points on the model for connecting one or more tendons. Each tendon may be associated with one or more feature points. A primary feature point for each tendon may be where an end of the simulated tendon is connected (e.g., a point of connection), such as a fingertip or end portion of an appendage. Other feature points may include, for example, other connection points along a tendon routing where a tendon passes through the appendage and/or base. At step 604, sample data is generated for a plurality of tendon actuations. For example, a user may provide physical input through one or more motion capture systems. In non-limiting embodiments, a plurality of actuations may be simulated without use of a motion capture device. At step 606, an ANN may be trained through any number of methods using the sample data. As described herein, the sample data may include training data for this purpose and separate testing data for testing the trained ANN. The ANN training may be supervised or unsupervised. Once the ANN is trained, it may then be used to simulate tendon actuations. Although FIG. 6 illustrates a non-limiting example using an ANN, as described herein other techniques may be used.

Still referring to FIG. 6, at step 608, an input vector is generated for the ANN based on one or more feature points. For example, a user may move a feature point on a GUI by dragging it or through some other means. The location of the feature point(s) in the tendon actuation space is used to generate an input vector representing these values. At step 610, the input vector is processed with the ANN to result in one or more simulated tendon actuations based on the feature point(s). At step 612, it is determined whether the user has edited one or more feature point locations and, if the feature points have been changed, the method proceeds to step 608 and another input vector is created. If the user does not change an existing tendon at step 612, the user may still modify the tendon arrangement at step 614 by adding additional tendons. If the user adds additional tendons, the method may proceed to step 602 to add the tendon to the model and to train the ANN accordingly. Once the user is done modifying the tendon arrangement, at step 616 the fabrication of the manipulation device is continued by connecting physical tendons to the manipulation device based on the simulation.

In some examples, hysteresis occurs in which the manipulation device may not return to its original shape (e.g., resting pose) when all tendons are un-actuated. This may be caused by the friction between tendons and the skin or material forming the body and/or appendage(s), which may be sufficient enough such that returning exactly to the original pose is not feasible. In non-limiting embodiments, the antagonistic nature of the extensor and flexor tendons may be utilized to intelligently actuate the corresponding tendons that act antagonistically to the tendons used in the prior pose. Thus, responsive counter action serves as a restoring force to overcome the hysteresis. In non-limiting embodiments, hysteresis may also be addressed by embedding controllable stiffness elements into the manipulation device, such as into the material used to form the base and/or appendages, to stiffen the material back into its resting pose. Embedded controllable stiffness elements may also be used to increase or decrease a stiffness of the material based on a particular application, such as increasing material stiffness for pushing or pressing actions.

The resting pose of the manipulation device predefines the range of motion possible independently of the tendon arrangement. Thus, in non-limiting embodiments, the geometry of the manipulation device itself may be simulated prior to fabrication to evaluate its efficacy for any particular purpose. As an example, simulation of the geometry of the manipulation device may allow a user to design the appendages and/or base (e.g., fingers and/or palm of a human-like hand) to avoid localized stiffening by decreasing the thickness of the appendages and/or base. Various other geometric changes may also be simulated to avoid iterating through multiple physical prototypes.

Depending on the underlying task, certain poses are more suitable than others. For example, with human-like hand geometries, flat rest poses experience difficulties grasping large objects such as tennis balls due to the inability of the fingers to curl around the object and oppose the palm. An advantage of flat rest poses over curled rest poses is that flat rest poses may restore itself back to an original shape and therefore may not need extensor tendons for this purpose. As a result, additional tendons may be added to the front of the appendages to increase the overall dexterity and range of motion of the design.

Generating synthetic data has a computation expense that is exponential to the number of tendons. Therefore, even with additional tendons that would make more complex poses realizable, predictions and assumptions are used to decrease the amount of processing. Moreover, in non-limiting embodiments, parallelizable simulation and cloud computing may be used to handle large amounts of data and computations. The motion of independent appendages (e.g., fingers of the same hand) may be correlated to varying degrees. Thus, in non-limiting embodiments, each appendage may be trained separately and used as an a priori model to train the entire manipulation device using fewer data points. Moreover, the material properties for the materials used for the appendages, base, and/or tendons may not be precisely known, including frictional forces. Thus, in non-limiting embodiments, a motion capture system may be used to capture the motion of the manipulation device being controlled while performing various poses. This reinforcement learning scheme may be used to improve the accuracy during training or in-situ.

In non-limiting embodiments in which the appendages of the manipulation device do not have joints, the tendon placement and material properties of the appendage primarily affect the variety and complexity of achievable poses. For example, different tendon placements and actuations on a thumb of a hand-like manipulation device enables either lateral or opposing grasps. In non-limiting embodiments, poses utilizing an opposable thumb may be used where a stronger grip (e.g., a grip having greater pullout force) is desired. This flexibility provides significant advantages over other approaches, such as pneumatically actuated designs, because the kinematics can be easily changed on the manipulation device for different applications.

In non-limiting embodiments, the design of the manipulation device, including the base and/or appendages, may be at least partially automated. Because there are numerous possibilities of tendon routings and manipulation device arrangements, task-specific manipulation devices may be automatically designed to optimize the performance of a given task.

Figure 7:
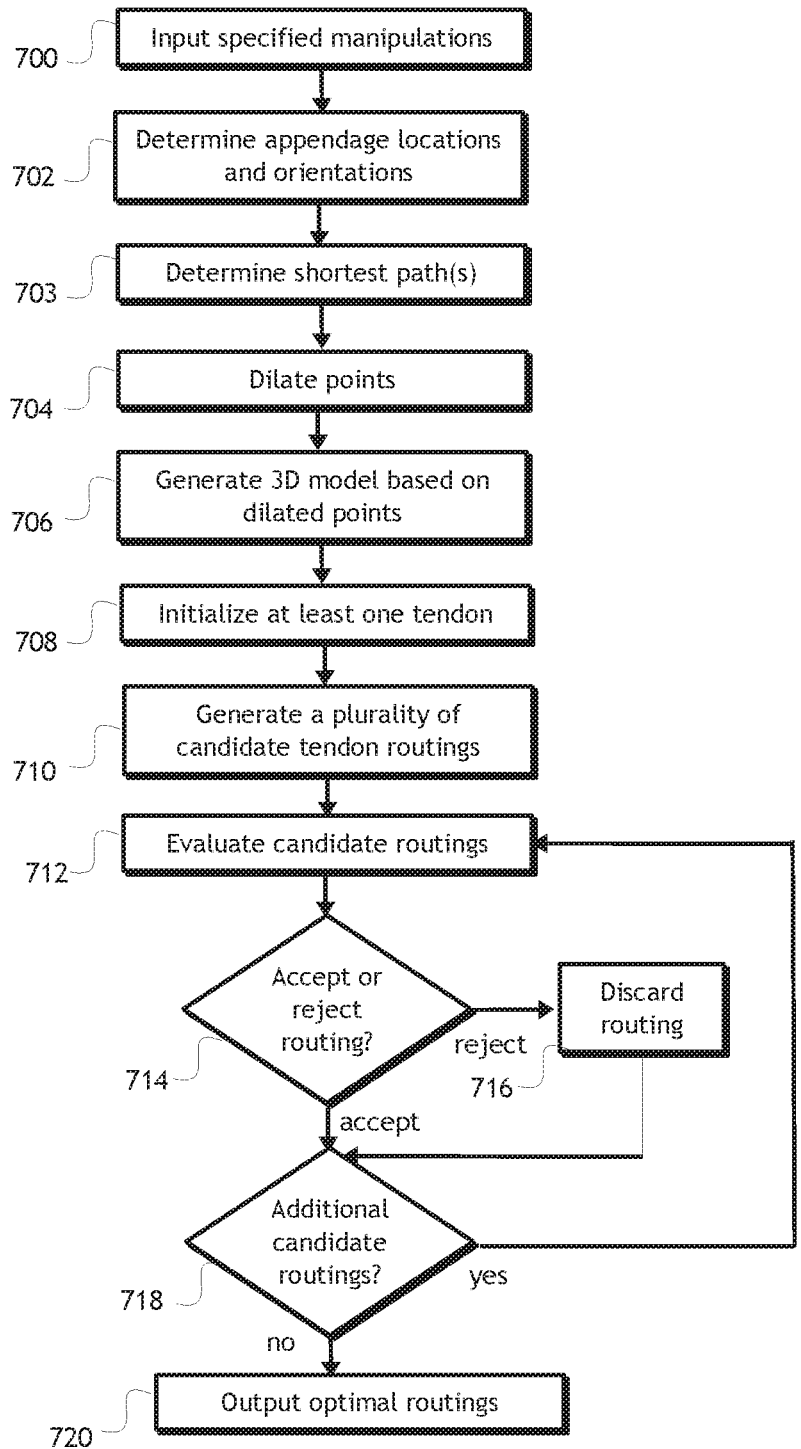
FIG. 7 is a flow diagram for a method of optimizing the design of a manipulation device according to a non-limiting embodiment.

Referring now to FIG. 7, a flow diagram for a method of automatically designing a manipulation device is shown according to a non-limiting embodiment. It will be appreciated that the steps shown in FIG. 7 are for exemplary purposes only and that fewer, additional, and/or different steps, and/or a different order of steps, may be used in non-limiting embodiments. At step 700, specified manipulations are inputted by a user. For example, a motion capture system (e.g., a CyberGlove, computer vision, and/or the like) may be used to capture and record actual manipulations performed by a user. Based on such user input, at step 702 appendage positions and orientations (e.g., fingertip positions and orientations) may be extracted and used to deform the 3D model of the manipulation device into the desired pose. The positions and orientations of the fingertips (and/or other portions of the appendages) are recorded and used as targets (e.g., goal trajectories) for optimization. For example, for a given pose, 3D positions of the metacarpophalangeal (MCP) joint, proximal interphalangeal (PIP) joint, and distal interphalangeal (DIP) joints, and the distal end of the fingertips may be recorded.

Figure 8A:
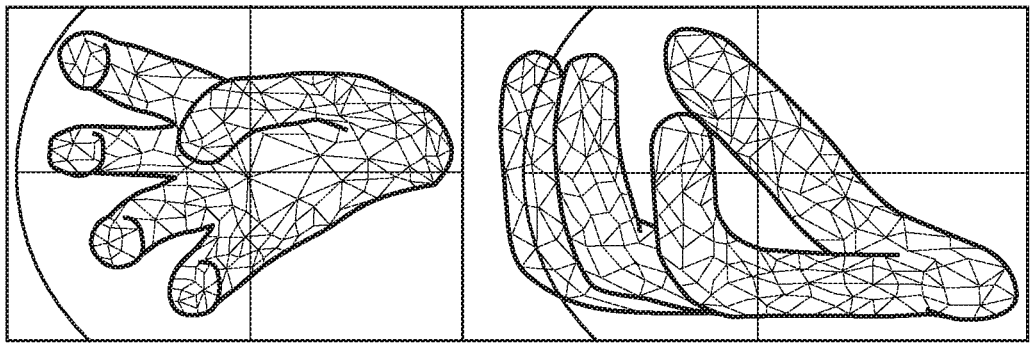
FIGS. 8A-8D illustrate different stages of a method of optimizing the design of a manipulation device according to a non-limiting embodiment.

The 3D model may be modified to optimize the design, size, and/or shape of the manipulation device for a given task. For example, a new model may be obtained by growing the existing model, based on one or more task-specific poses, along a set of 3D feature points, such as areas representing end portions of an appendage, joints, curves, appendage connections, and/or the like. For example, and with continued reference to FIG. 7, a graph traversal algorithm (e.g., such as an A* search algorithm or any suitable optimal-path algorithm) may be implemented at step 703 to determine a shortest path to connect the base of the manipulation device (e.g., a base of the palm) with the set of recorded joint positions or other feature point locations, using a plurality of nodes defining the surface boundary of the 3D model. The points may be represented in a 3D grid space, as shown in the two examples in FIG. 8A. Points that are located along the shortest path are added to the set of joint positions such that the set of joint positions includes a representation of points on the model that are able to achieve the desired pose and task-specific manipulation.

Figure 8B:
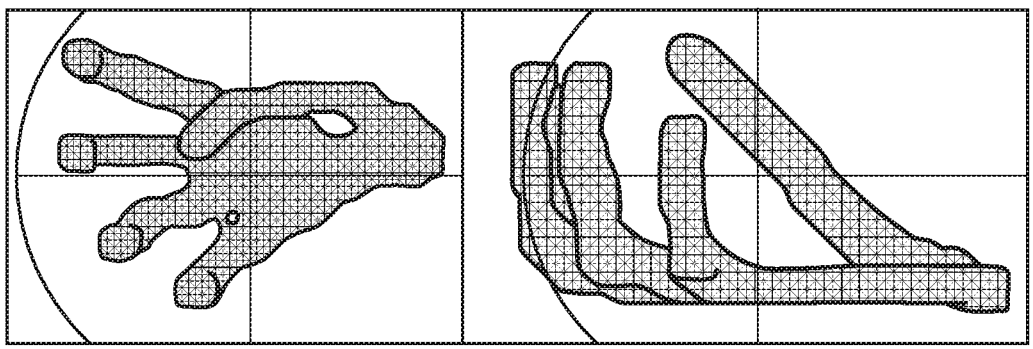
Figure 8C:
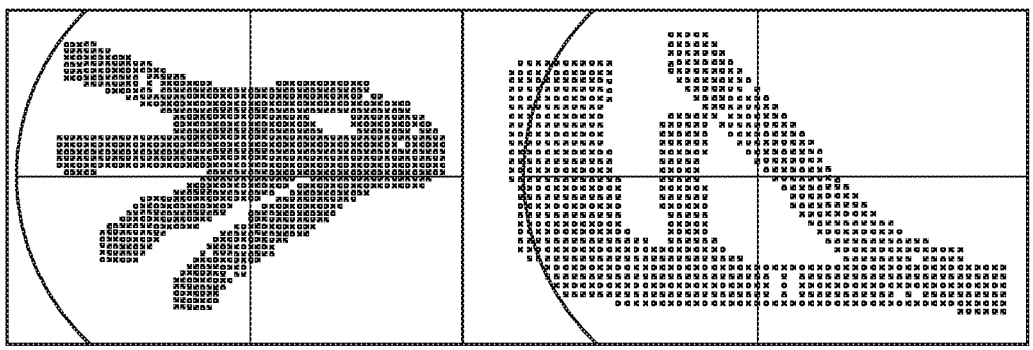
Figure 8D:
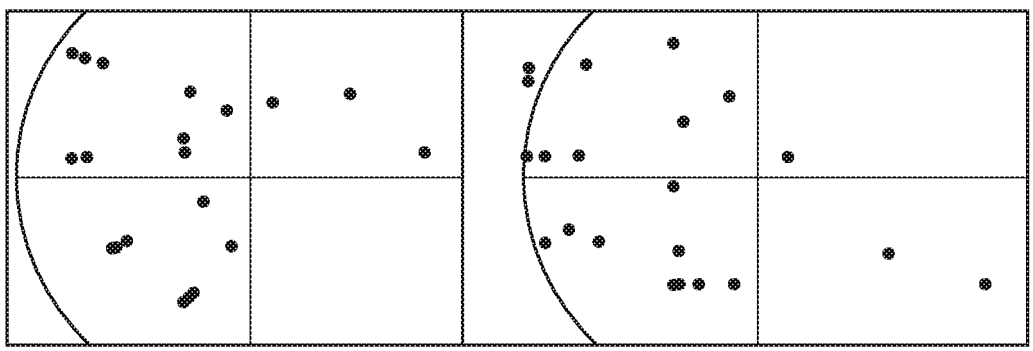

Still referring to FIG. 7, at step 704, in order to further increase the volume of the 3D model, occupied points (e.g., points along the shortest path) may be iteratively dilated towards directions of unoccupied grid points. Two examples are shown in FIG. 8B. The overall grid size and the amounts of dilation operations may be specified by the user in some non-limiting embodiments. As an example, a grid size of 200×200×200 may be used and a total of two dilation operations may be executed, although various grid sizes and dilation operations may be used. At step 706, a 3D model may be generated based on the dilated points. For example, a Delaunay tetrahedralization may then be generated based on the set of 3D points using TetGen or another like software tool. The resulting convex hull may then be shaped using an alpha shaping algorithm. Two examples are shown in FIG. 8C. After the hull is shaped, a series of mesh operations may be executed (e.g., with a software tool such as MeshLab or the like). This may involve converting the volumetric mesh model into a surface mesh model and smoothing the surface using a smoothing operation (e.g., such as a laplacian smoothing operation). The mesh model may be refined or coarsened (e.g., distance between surface boundary points) depending on the required accuracy of the simulation.

At step 708, tendon placements are optimized for the 3D model generated at step 706. A plurality of tendons are randomly placed on the mesh model and are contracted, and the resulting poses are each compared to the desired goal pose. In non-limiting embodiments, a Metropolis-Hastings algorithm may used, which either accepts or rejects newly created tendon routings and activations based on their calculated cost. It will be appreciated that other Markov Chain Monte Carlo (MCMC) approaches are possible. To deal with the large amount of local minimums, the concept of cooling a temperature as found in Simulated Annealing may be introduced. This allows the algorithm to accept solutions in the early stages that are worse than previous solutions and as a result, escape local minima. A non-limiting implementation of the process is shown in the following algorithm (Algorithm 1):

---

Algorithm 1 Tendon routing optimization

---

1: $\vec{T}, \vec{\alpha}$ = initialize (M)
2: function SIMULATEDANNEALING(M,$\vec{T},\vec{\alpha}$)   M: Mesh, $\vec{T}$: Tendons, $\vec{\alpha}$: Contraction levels
3:     CurrS = (M, $\vec{T}, \vec{\alpha}$)
4:     while T > $T_{min}$ do
5:         while i < MaxIterationPerEpoch do
6:             NewS = CreateNewS(CurrS)
7:             Cost = CalcCost(NewS)
8:             Acceptance = CalcAcceptance(CurrS, NewS, T)
9:             if Acceptance = true then
10:                CurrS = NewS
11:            i + +
12:        T = αT
13:        i = 0

---

While the temperature T is larger than a minimum temperature $T_{min}$, the algorithm iteratively modifies the current solution, calculates its new cost, and then either accepts or rejects the new solution. A solution may be encoded by the anchoring nodes along which the tendons are routed as well as the respective contraction levels in each timestep.

With continued reference to FIG. 7, at step 708, one or more simulated tendons are initiated. Simulated tendons may be initiated in various ways. In non-limiting embodiments, a tendon is represented by a number of waypoints along which it is routed, and these points may be referred to as "anchoring nodes." For each tendon, tendon routing optimization is initialized by sampling n anchoring nodes from a discrete uniform distribution U(0, N), with N being the number of nodes in the mesh. Because tendons are routed through the skin along the surface of the material comprising the appendage and/or base, tendons in simulation are restricted to run along edges on the surface of the mesh. Additionally, the first node of each tendon $n_1$ may only be sampled from fixed nodes at the base of the mesh, so as to ensure that, on the physical manipulation device, tendons begin close to the base where they can be connected to an actuation device. After sampling the anchoring nodes, the corresponding tendon may be obtained by executing an optimal-path algorithm (e.g., an A* algorithm) to find the shortest path along the mesh that connects the sampled nodes.

At step 710 of FIG. 7, new candidate solutions for different tendon routings may be generated by combining two sampling steps: a first sampling step to create a new tendon routing $\vec{T}$, and a second sampling step to sample new contraction levels $\vec{\alpha}$. To create new candidate tendon routings, one anchoring node from each tendon may be changed at each iteration. For switching out nodes, a heuristic algorithm is applied which favors transitions to adjacent nodes over transitions to nodes that are located farther away. This may be implemented, for example, by creating a set of neighboring nodes which are in direct or close adjacency to the node that is being changed. For this purpose, a lookup table may be constructed at initialization of the tendon that corresponds each node in the mesh to node identifiers for each adjacent node. This ensures that at each sampling step the d-adjacent nodes can be quickly determined without exhaustively searching the entire mesh.

In non-limiting embodiments, the sampling step of a new anchoring node may be further divided into two individual samplings. A first sampling step may sample the search depth d~U(0, D) from a discrete uniform distribution, with the maximum search depth D serving as a hyper-parameter that defines the maximum depth of nodes to be considered for transitions. A depth of d=1 means that only directly neighboring nodes are contained in the set of candidate nodes, whereas in the case of d=2 nodes that are adjacent to the direct neighbors can also serve as candidates for transitions. A second sampling step may involve sampling the actual node from the constructed set of neighboring nodes. Due to the first uniform sampling step, nodes that are closer in distance are more likely to be contained in the set of candidate nodes and thus are more likely to be transitioned to after the second sampling step. This ensures transitions that do not significantly change the energy of the system, which avoids unintended randomness.

In addition to anchoring nodes, new contraction levels ~at+1 are created by sampling variations D from a normal distribution $\Delta \sim N(0.0, 0.5)$ and applying them to the current contraction levels as follows:

$$\vec{\alpha}_{t+1} = \vec{\alpha}_t + \Delta$$

With continued reference to FIG. 7, at step 712, once candidate routings are generated, the candidate routings may then be evaluated. In non-limiting embodiments, the evaluation process identifies tendon routings that can achieve certain grasps and transitions, thus the "cost" of a tendon routing for purposes of evaluation is whether one or more goal poses are achieved. For each goal pose, a set of fingertip coordinates $\{\vec{P}_1, \vec{P}_2, \ldots, \vec{P}_n\}_{goal}$ and normal $\{N_1,$ $\vec{N}_2 \ldots, \vec{N}_n\}_{goal}$ is recorded. Based on this goal specification, different variations of evaluating candidate solutions may be applied. For example, the cost of the solution may be calculated as the RMS error of the Euclidean distance between desired and current fingertip positions for a desired pose. This measure may be complemented by calculating the normals offset of each fingertip in radians using the law of cosines. The total cost of a solution may therefore be a weighted sum of distance and normals offset, and may be calculated as in the following algorithm (Algorithm 2):

---

Algorithm 2 Calculate cost of tendon routing

---

1: function CALCCOST(Solution)
2:   totalCost = 0
3:   for each p ∈ GoalPoses do 4:   $$\text{cost}_d(p) = \sqrt{\frac{\sum_{i=1}^{n} \left(P(p)_{i,goal} - P(p)_{i,current}\right)^2}{n}}$$

5:   $$\text{cost}_o(p) = \left(\sum_{i=1}^{n} \cos^{-1}\left(\frac{N(p)_{i,goal} \cdot N(p)_{i,current}}{|N(p)_{i,goal}||N(p)_{i,current}|}\right)\right) \quad \text{n: Number of fingertips}$$

6:   totalCost += $\alpha_d \text{cost}_d(p) + \alpha_o \text{cost}_o(p)$
     return totalCost

---

Depending on the problem, the weights ad and do may be adjusted accordingly to account for different units or to weight one objective more heavily than the other. Since the manipulation device may not include rigid links and joints, and instead may deform continuously, the joint angles of the human hand may not be used to infer the similarity of a semi-rigid hand pose to a human hand pose. In non-limiting embodiments, this is avoided by using only the fingertip poses to evaluate the cost of a candidate solution.

In non-limiting embodiments, a solution is considered to be successful if the average position error of all appendages is less than 1 cm. In contrast to traditional rigid robots, where this error margin would present concerns, it has been demonstrated that due to their compliant nature, flexible manipulation devices do not significantly suffer from such errors and are able to execute grasps successfully.

At step 714 of FIG. 7, it is determined whether to accept or reject each candidate tendon routing. This determination may be based on the following algorithm (Algorithm 3):

---

Algorithm 3 Acceptance of new solutions

---

1:   function ACCEPTANCE(NewS, CurrS,T)
2.   if Cost(NewS) < Cost(CurrS) then
3:     CurrS = NewS
4.   if Cost(NewS) < Cost(BestS) then
5:     BestS = NewS     Keep track of best solution
6:   else Cost(NewS) > Cost(CurrS)

7:   $$P_{acc} = e^{-\frac{\Delta cost}{T}}$$

8:   if $P_{acc}$ > rand: ∈ [0, 1] then
9:     CurrS = NewS

---

Algorithm 3 represents an implementation of an acceptance criterion for simulated annealing. Using this algorithm, if the new tendon routing performs better in terms of cost than the routing from the previous iteration, the new routing is accepted. However, a greedy-search is avoided by also accepting uphill moves. The probability of accepting an uphill move depends on the temperature T and the magnitude of the cost difference $\Delta_{cost}$=Cost(NewS)=Cost(CurrS) according to:

$$P_{acc}(T, \Delta_{cost}) = e^{-\frac{\Delta_{cost}}{T}}.$$

If the new tendon routing does not perform better than the routing from the previous generation, the method may proceed to step 716 and the tending routing may be discarded. At step 718, the method loops back to step 712 if there are additional candidate routings to evaluate and/or to step 714 to determine whether to accept or reject the next candidate routing. At step 720, one or more optimal tendon routings are output for fabricating a manipulation device.

In non-limiting embodiments, if an optimized tendon routing solution requires fewer tendons than modeled to realize a pose, some tendons in the solution may not be contracted and therefore may be omitted when fabricating the physical manipulation device.

Figure 9:
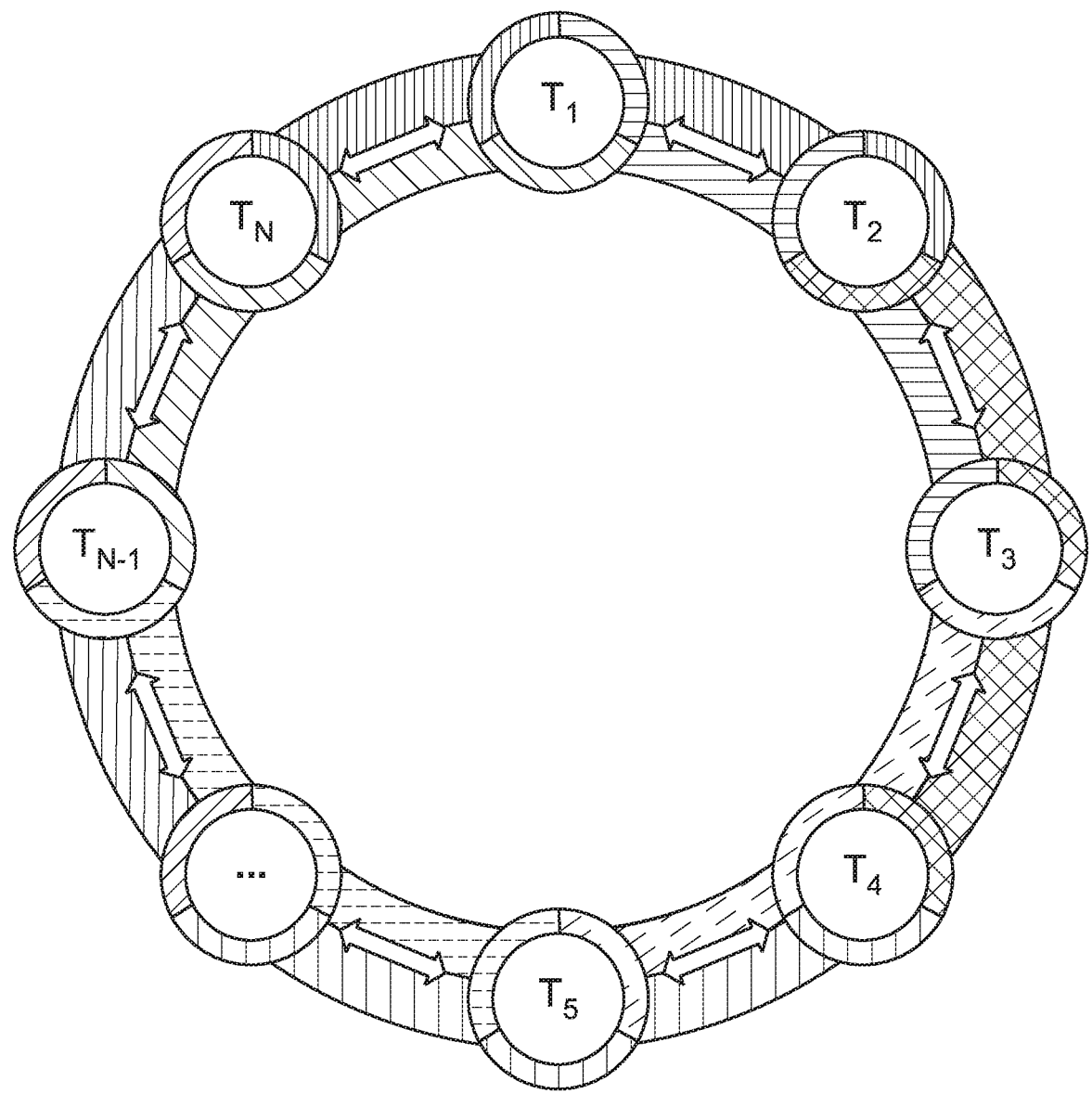
FIG. 9 illustrates processing threads for optimizing the design of a manipulation device according to a non-limiting embodiment.

In non-limiting embodiments, the algorithm(s) for determining an optimal tendon routing may be processed with multiple threads. Depending on available processors, a number of N threads may be created. At startup, each thread may be initialized independently of another with a random tendon routing. With reference to FIG. 9, an illustration of the threads ($T_1$, $T_2$, $T_3$, $T_4$, $T_5$, . . . , $T_N$) are shown. The threads may be arranged in a closed circuit consisting of neighborhoods (depicted as differently hatched sections) in which communication between threads may take place. After a number of $N_{epoch}$ iterations, all threads output their best solution achieved so far and exchange it with better solutions from other threads that are located within the same neighborhood (e.g., $T_2$ shares with $T_1$ and $T_3$). The size of the neighborhood thereby determines how quickly information about the optimization domain is spread. The amount of iterations per epoch after which communication takes places and the size of the neighborhoods serves as a hyper-parameter to guide exploration and exploitation. Larger neighborhoods and shorter epochs increase exploitation while relatively smaller neighborhoods and relatively longer epochs improve exploration of the solution space.

Although embodiments have been described in detail for the purpose of illustration, it is to be understood that such detail is solely for that purpose and that the disclosure is not limited to the disclosed embodiments, but, on the contrary, is intended to cover modifications and equivalent arrangements that are within the spirit and scope of the appended claims. For example, it is to be understood that the present disclosure contemplates that, to the extent possible, one or more features of any embodiment can be combined with one or more features of any other embodiment.

The invention claimed is:

1. A method for fabricating a tendon-driven manipulation device comprising at least one appendage, the method comprising:
generating, with at least one processor, a three-dimensional model of the manipulation device;
generating, with the at least one processor, at least one simulated tendon connected to the three-dimensional model based on at least one location on the at least one appendage of the three-dimensional model;
training, with the at least one processor, an artificial neural network based on simulated activations of the at least one simulated tendon, wherein each simulated activation is based on the at least one location of the at least one simulated tendon and results in at least one pose of the at least one appendage;
modifying, with the at least one processor, the at least one location of the at least one simulated tendon;
simulating, with the at least one processor, a plurality of poses of the at least one appendage based on the artificial neural network and the at least one location; and
connecting at least one tendon to the at least one appendage of the manipulation device based on the location of the at least one simulated tendon.

2. The method of claim 1, further comprising forming the at least one appendage from at least one of the following materials: foam, silicone, an elastomer, polydimethylsiloxane, rubber, plastic, biological material, nanomaterial, cork, compressed textiles, or any combination thereof.

3. The method of claim 1, wherein forming the at least one appendage further comprises covering at least a portion of the appendage with a skin.

4. The method of claim 3, wherein connecting the at least one tendon to the manipulation device comprises connecting the tendon to the skin.

5. The method of claim 1, wherein the at least one tendon comprises a flexor tendon and an extensor tendon, and wherein the at least one simulated tendon comprises a simulated flexor tendon and a simulated extensor tendon.

6. The method of claim 1, wherein the at least one appendage comprises a plurality of fingers.

7. The method of claim 6, wherein the manipulation device comprises a molded or printed human hand.

8. The method of claim 1, wherein connecting the at least one tendon to the manipulation device comprises:
connecting a first end of the at least one tendon to a location corresponding to the location of the at least one simulated tendon; and
passing the at least one tendon through a portion of a base connected to the at least one appendage or a portion of the at least one appendage between the base and the location.

9. The method of claim 8, further comprising connecting a second end of the at least one tendon to an actuation device configured to actuate the at least one tendon.

10. The method of claim 8, wherein the at least one simulated tendon is generated based further on a simulated connection point located on the three-dimensional model, wherein each simulated activation is based further on a location of the simulated connection point, and wherein passing the at least one tendon through the portion of the base or the portion of the at least one appendage comprises passing the at least one tendon through a location on the base or the at least one appendage corresponding to the location of the simulated connection point.

11. The method of claim 1, wherein the at least one tendon comprises at least one of the following: a string, a wire, a cable, or any combination thereof.

12. The method of claim 1, wherein the simulated activations of the at least one tendon are based on at least one of the following tendon properties: elasticity, stiffness, slack, strength, bend radius, friction, material type, or any combination thereof.

13. The method of claim 1, wherein the at least one appendage comprises a joint, and wherein connecting the at least one tendon to the manipulation device comprises;
connecting a first end of the at least one tendon to the location of the at least one simulated tendon; and
passing the at least one tendon through a portion of the at least one appendage below the joint such that the joint is arranged between the location and the portion of the at least one appendage.

14. The method of claim 1, wherein the at least one location on the at least one appendage is identified based on user input, and wherein the at least one location is modified based on additional user input.

15. A system for fabricating a tendon-driven manipulation device comprising at least one appendage, the system comprising:
a manipulation device comprising a base, at least one appendage extending from the base, and at least one tendon connected to the appendage; and
at least one computing device programmed or configured to:
generate a three-dimensional model of the manipulation device;
generate at least one simulated tendon relative to the three-dimensional model based on at least one location on the at least one appendage of the three-dimensional model;
train an artificial neural network based on simulated activations of the at least one simulated tendon, wherein each simulated activation is based on the at least one location of the at least one simulated tendon and results in at least one pose of the at least one appendage;
modify the at least one location of the at least one simulated tendon; and
simulate a plurality of poses of the at least one appendage based on the artificial neural network and the at least one location, wherein the at least one tendon is connected to the manipulation device based on the location of the at least one simulated tendon.

16. The system of claim 15, wherein the manipulation device further comprises a skin, and wherein the at least one tendon is connected to the skin.

17. The system of claim 15, wherein the at least one tendon comprises a flexor tendon and an extensor tendon, and wherein the at least one simulated tendon comprises a simulated flexor tendon and a simulated extensor tendon.

18. The system of claim 15, wherein a first end of the at least one tendon is connected to a location corresponding to the location of the at least one simulated tendon, and wherein the at least one tendon passes through a portion of the base or a portion of the at least one appendage between the base and the location.

19. The system of claim 15, wherein the at least one simulated tendon is generated based further on a simulated connection point located on the three-dimensional model, wherein each simulated actuation is based further on a location of the simulated connection point, and wherein the at least one tendon passes through a location on the base or the at least one appendage corresponding to the location of the simulated connection point.

20. A computer program product for simulating a tendon-driven manipulation device comprising at least one appendage, comprising at least one non-transitory computer-readable medium including program instructions that, when executed by a computing device, cause the computing device to:

generate a three-dimensional model of the manipulation device;

generate at least one simulated tendon on the three-dimensional model based on at least one location on the at least one appendage of the three-dimensional model;

train an artificial neural network based on simulated activations of the at least one simulated tendon, wherein each simulated activation is based on the at least one location of the at least one simulated tendon and results in at least one pose of the at least one appendage;

modify the at least one location of the at least one simulated tendon; and simulate a plurality of poses of the at least one appendage based on the artificial neural network and the at least one location, wherein the at least one tendon is connected to the manipulation device based on the location of the at least one simulated tendon.

* * * * *